(12) United States Patent
Cho et al.

(10) Patent No.: US 11,961,788 B2
(45) Date of Patent: Apr. 16, 2024

(54) SEMICONDUCTOR DEVICE INCLUDING THROUGH-ELECTRODES

(71) Applicant: SAMSUNG ELECTRONICS CO., LTD., Suwon-si (KR)

(72) Inventors: Hyoukyung Cho, Seoul (KR); Hojin Lee, Hwaseong-si (KR); Kwangjin Moon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 107 days.

(21) Appl. No.: 17/708,137

(22) Filed: Mar. 30, 2022

(65) Prior Publication Data
US 2022/0399251 A1 Dec. 15, 2022

(30) Foreign Application Priority Data
Jun. 11, 2021 (KR) .......................... 10-2021-0075944

(51) Int. Cl.
| H01L 23/48 | (2006.01) |
| H01L 21/762 | (2006.01) |
| H01L 21/768 | (2006.01) |
| H01L 25/065 | (2023.01) |
| H01L 29/06 | (2006.01) |

(52) U.S. Cl.
CPC ...... *H01L 23/481* (2013.01); *H01L 21/76224* (2013.01); *H01L 21/76816* (2013.01); *H01L 21/76898* (2013.01); *H01L 25/0657* (2013.01); *H01L 29/0649* (2013.01); *H01L 2225/06544* (2013.01)

(58) Field of Classification Search
CPC ............... H01L 23/481; H01L 23/5286; H01L 29/0649; H01L 23/522; H01L 21/76224; H01L 21/76898; H01L 24/06; H01L 25/0657
USPC .......................................... 257/263; 438/192
See application file for complete search history.

(56) References Cited

U.S. PATENT DOCUMENTS

| 9,331,062 B1 | 5/2016 | Lane et al. |
| 10,636,739 B2 | 4/2020 | Beyne et al. |
| 2011/0068466 A1 | 3/2011 | Chen et al. |

(Continued)

*Primary Examiner* — Thinh T Nguyen
(74) *Attorney, Agent, or Firm* — F. Chau & Associates, LLC

(57) ABSTRACT

A semiconductor device includes: a semiconductor substrate having opposing first side and second sides; an active region and an isolation region on the first side; a circuit device on the active region; a front side interconnection structure on the first side and including front side interconnection layers disposed on different levels; first and second back side interconnection structures below the second side; a buried structure having a portion disposed in the isolation region and including a conductive line; a first through-electrode structure including a first through-electrode contacting the conductive line and penetrating the semiconductor substrate between the conductive line and the first back side interconnection structure; and a second through-electrode structure including a second through-electrode penetrating the semiconductor substrate between a first front side interconnection layer and the second back side interconnection structure. The first front side interconnection layer is on a level higher than that of the conductive line.

13 Claims, 26 Drawing Sheets

(56) References Cited

U.S. PATENT DOCUMENTS

| | | | |
|---|---|---|---|
| 2014/0084428 A1* | 3/2014 | Heller et al. | H01L 23/481 |
| | | | 257/621 |
| 2020/0105671 A1 | 4/2020 | Lai et al. | |
| 2020/0203276 A1 | 6/2020 | Hiblot et al. | |
| 2020/0273780 A1 | 8/2020 | Park et al. | |
| 2020/0373331 A1 | 11/2020 | Kim et al. | |

\* cited by examiner

SEMICONDUCTOR DEVICE INCLUDING THROUGH-ELECTRODES

CROSS-REFERENCE TO RELATED APPLICATION(S)

This application claims priority under 35 U.S.C. § 119 to Korean Patent Application No. 10-2021-0075944, filed on Jun. 11, 2021 in the Korean Intellectual Property Office, the disclosure of which is incorporated by reference in its entirety herein.

TECHNICAL FIELD

Embodiments of the present disclosure relate to a semiconductor device including through-electrodes and a semiconductor package including the semiconductor device.

DISCUSSION OF RELATED ART

A semiconductor device that includes a through-silicon via (TSV) penetrating through a semiconductor substrate has been suggested to significantly shorten a path of an electrical signal in a semiconductor device mounted on a package substrate.

SUMMARY

Embodiments of the present disclosure provide a semiconductor device having increased performance.

Embodiments of the present disclosure provide a semiconductor device having increased integration density.

According to an embodiment, a semiconductor device includes a semiconductor substrate having a first side and a second side opposing each other. An active region and an isolation region are on the first side of the semiconductor substrate. A circuit device is disposed on the active region, on the first side of the semiconductor substrate. A front side interconnection structure is on the first side of the semiconductor substrate. The front side interconnection structure includes a plurality of front side interconnection layers, electrically connected to the circuit device and disposed on different levels from each other, and front side vias electrically connecting the plurality of front side interconnection layers to each other. The semiconductor device includes a first back side interconnection structure and a second back side interconnection structure. The first and second back side interconnection structures are disposed below the second side of the semiconductor substrate. The semiconductor device includes a buried structure having at least a portion thereof disposed in the isolation region. The buried structure includes a conductive line. A first through-electrode structure includes a first through-electrode directly contacting the conductive line and extending downwardly to penetrate through the semiconductor substrate between the conductive line and the first back side interconnection structure, and a first insulating spacer on lateral side surfaces of the first through-electrode. A second through-electrode structure includes a second through-electrode penetrating through the semiconductor substrate between a first front side interconnection layer of the plurality of the front side interconnection layers, and the second back side interconnection structure. The second through-electrode directly contacting the first front side interconnection layer. The second through-electrode structure includes a second insulating spacer on lateral side surfaces of the second through-electrode. The first front side interconnection layer is disposed on a level higher than a level of the conductive line in relation to the second side of the semiconductor substrate.

According to an embodiment, a semiconductor device includes a semiconductor substrate having a first side and a second side opposing each other. An active region and an isolation region are on the first side of the semiconductor substrate. The semiconductor device includes a buried structure having at least a portion thereof disposed on the first side of the semiconductor substrate. The buried structure includes a conductive line. A front side interconnection structure includes a plurality of front side interconnection layers disposed on different levels from each other. The front side interconnection structure includes front side vias electrically connecting the plurality of front side interconnection layers. The front interconnection structure is on a level higher than a level of the conductive line. The semiconductor device includes a first back side interconnection structure and a second back side interconnection structure. The first and second back side interconnection structures are disposed below the second side of the semiconductor substrate. A first through-electrode structure includes a first through-electrode and a first insulating spacer on lateral side surfaces of the first through-electrode. The first through-electrode directly contacts the conductive line and extends downwardly to penetrate through the semiconductor substrate. A second through-electrode structure includes a second through-electrode and a second insulating spacer on lateral side surfaces of the second through-electrode. The second through-electrode penetrates through at least a portion of the semiconductor substrate. Each of the first and second back side interconnection structures includes a plurality of back side interconnection layers disposed on different height levels from each other, and back side vias electrically connected to the plurality of back side interconnection layers. A lower surface of the first through-electrode and a lower surface of the second through-electrode are disposed on a substantially same level. An upper surface of the second through-electrode is disposed on a level higher than a level of an upper surface of the first through-electrode.

According to an embodiment, a semiconductor device includes a semiconductor substrate having a first side and a second side opposing each other. An active region and an isolation region are on the first side of the semiconductor substrate. A front side interconnection structure includes a plurality of front side interconnection layers, disposed on different levels from each other on the first side of the semiconductor substrate, and front side vias electrically connecting the plurality of front side interconnection layers to each other. The semiconductor device includes a first back side interconnection structure and a second back side interconnection structure. The first and second back side interconnection structures are disposed below the second side of the semiconductor substrate. A first through-electrode structure includes a first through-electrode and a first insulating spacer on lateral side surfaces of the first through-electrode. The first through-electrode penetrates through at least a portion of the semiconductor substrate. A second through-electrode structure includes a second through-electrode and a second insulating spacer on lateral side surfaces of the second through-electrode. The second through-electrode penetrates through at least a portion of the semiconductor substrate. Each of the first and second back side interconnection structures includes a plurality of back side interconnection layers, disposed on different height levels from each other, and back side vias electrically connected to the plurality of back side interconnection layers. A lower surface of the first through-electrode and a lower surface of the second through-electrode are disposed on a substantially same level. An upper surface of the second through-electrode is disposed on a level higher than a level of an upper surface of the first through-electrode. The number of the plurality of front side interconnection layers disposed on different height levels is 'n' which is a positive integer greater than or equal to 4. The number of the plurality of back side interconnection layers disposed on different height levels is 'm' which is greater than or equal to 'n/2'.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION OF EMBODIMENTS

Hereinafter, embodiments of the present disclosure will be described with reference to the accompanying drawings.

In the descriptions below, terms "upper," "upper portion," "upper surface," "lower," "lower portion," "lower surface," "side surface," and the like, are used with reference to the diagrams unless otherwise indicated.

Figure 1A:
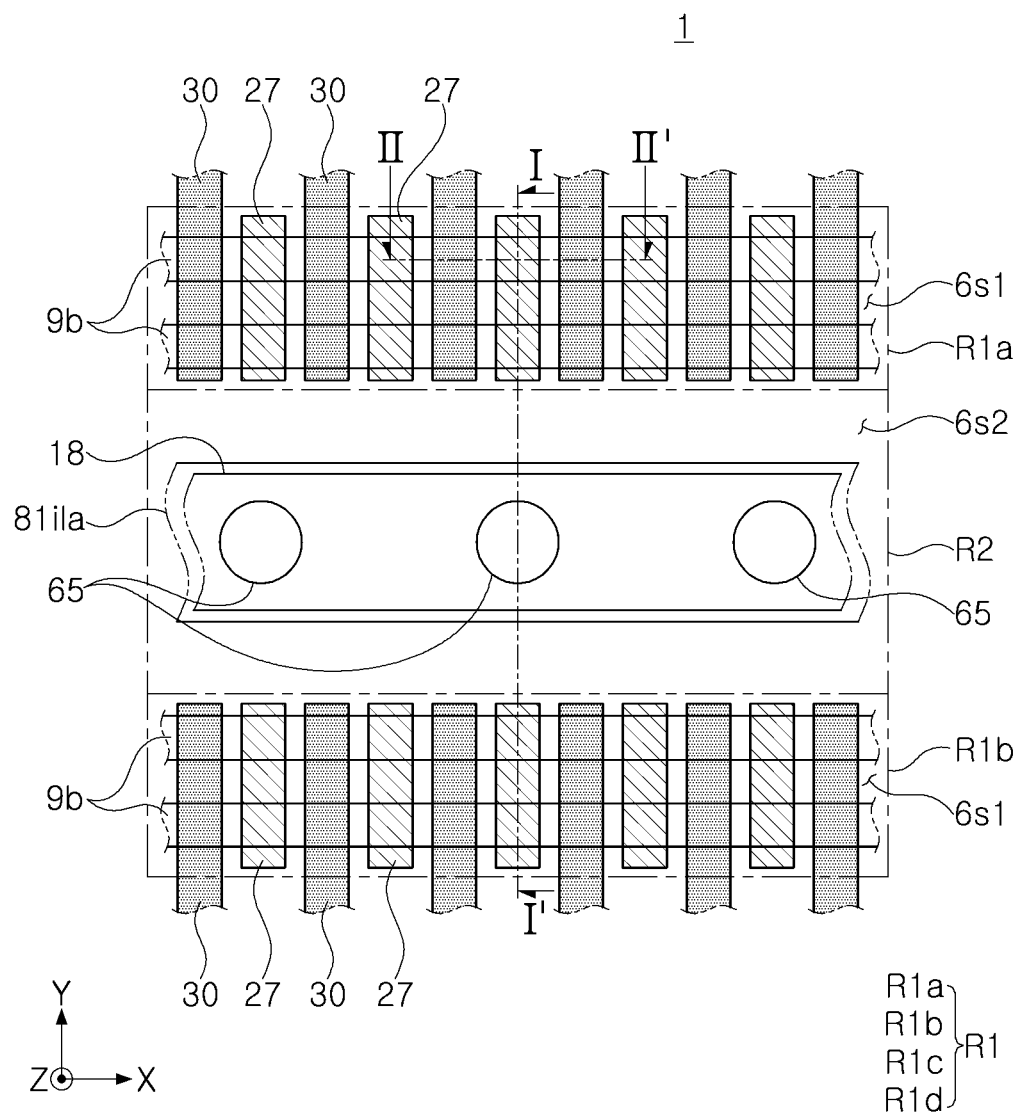
FIGS. 1A and 1B are plan views of a semiconductor device according to embodiments of the present disclosure.
Figure 1B:
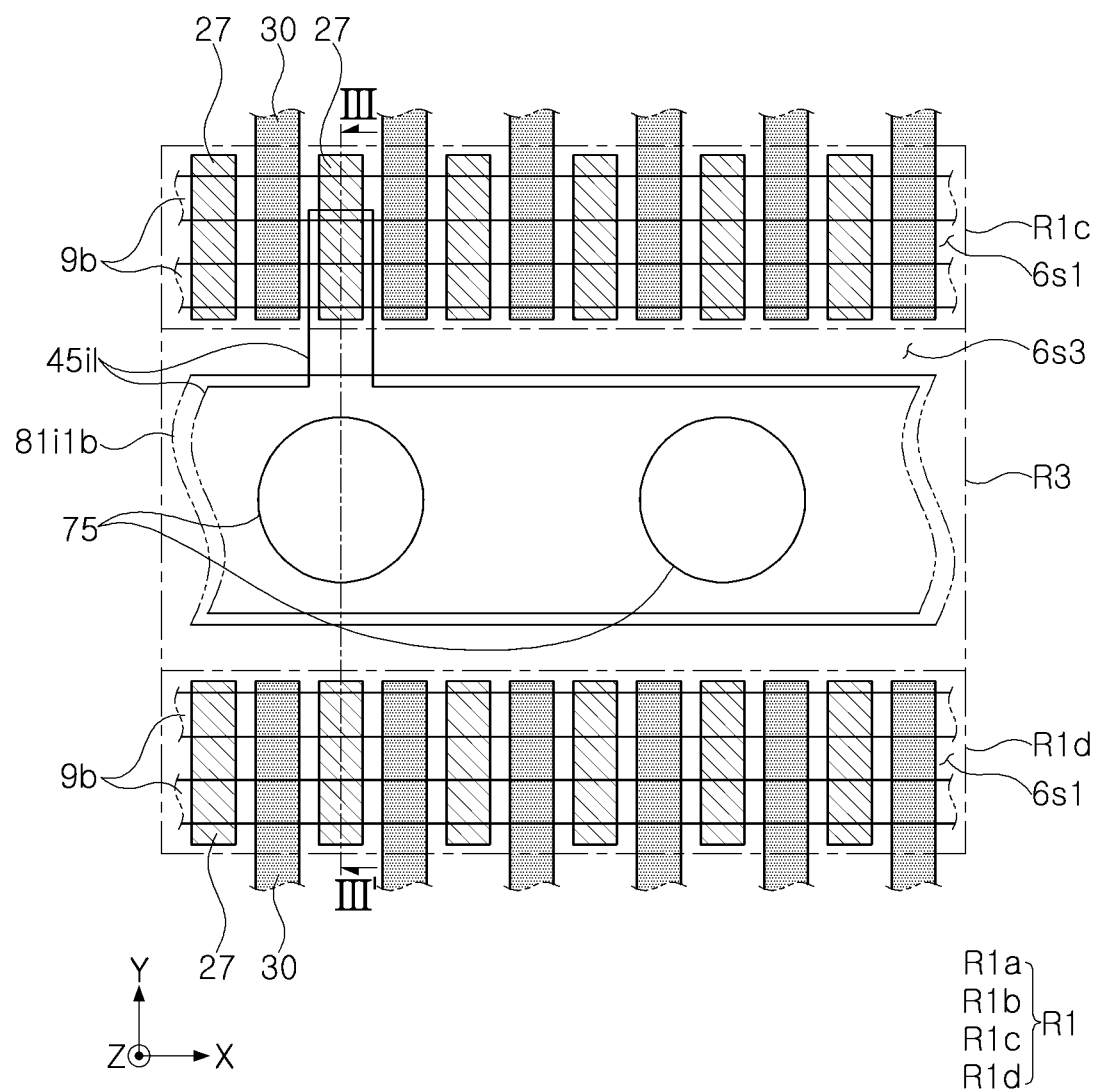
Figure 2A:
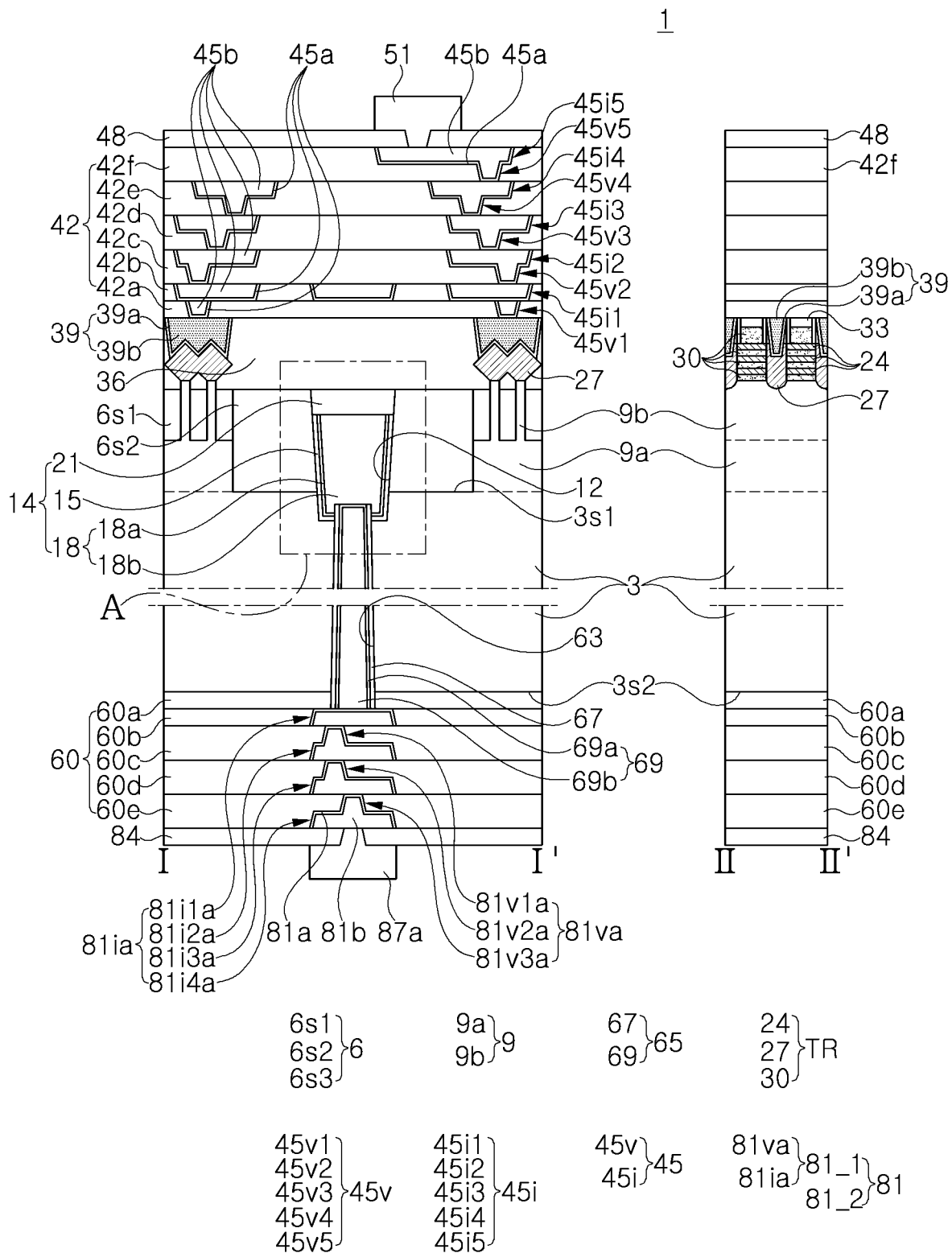
FIG. 2A is a cross-sectional view of a semiconductor device taken along lines I-I' and II-II' of FIG. 1A according to an embodiment of the present disclosure.
Figure 2B:
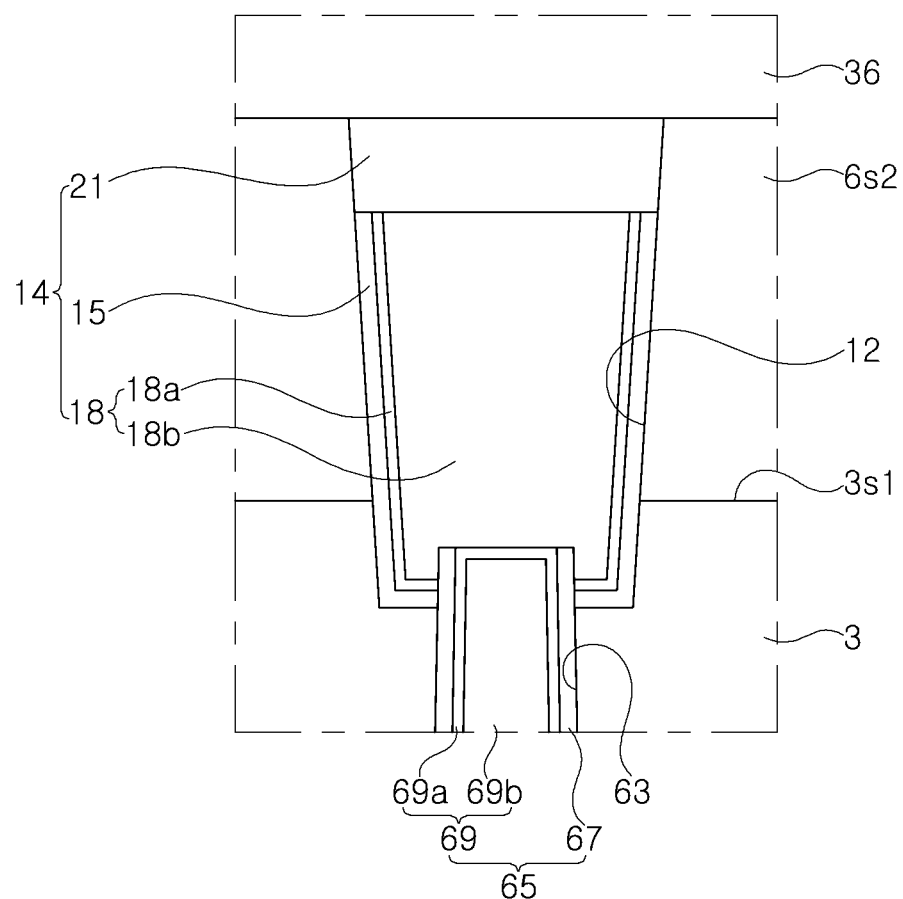
FIG. 2B is a partially enlarged view of portion A of FIG. 2A according to an embodiment of the present disclosure.
Figure 3A:
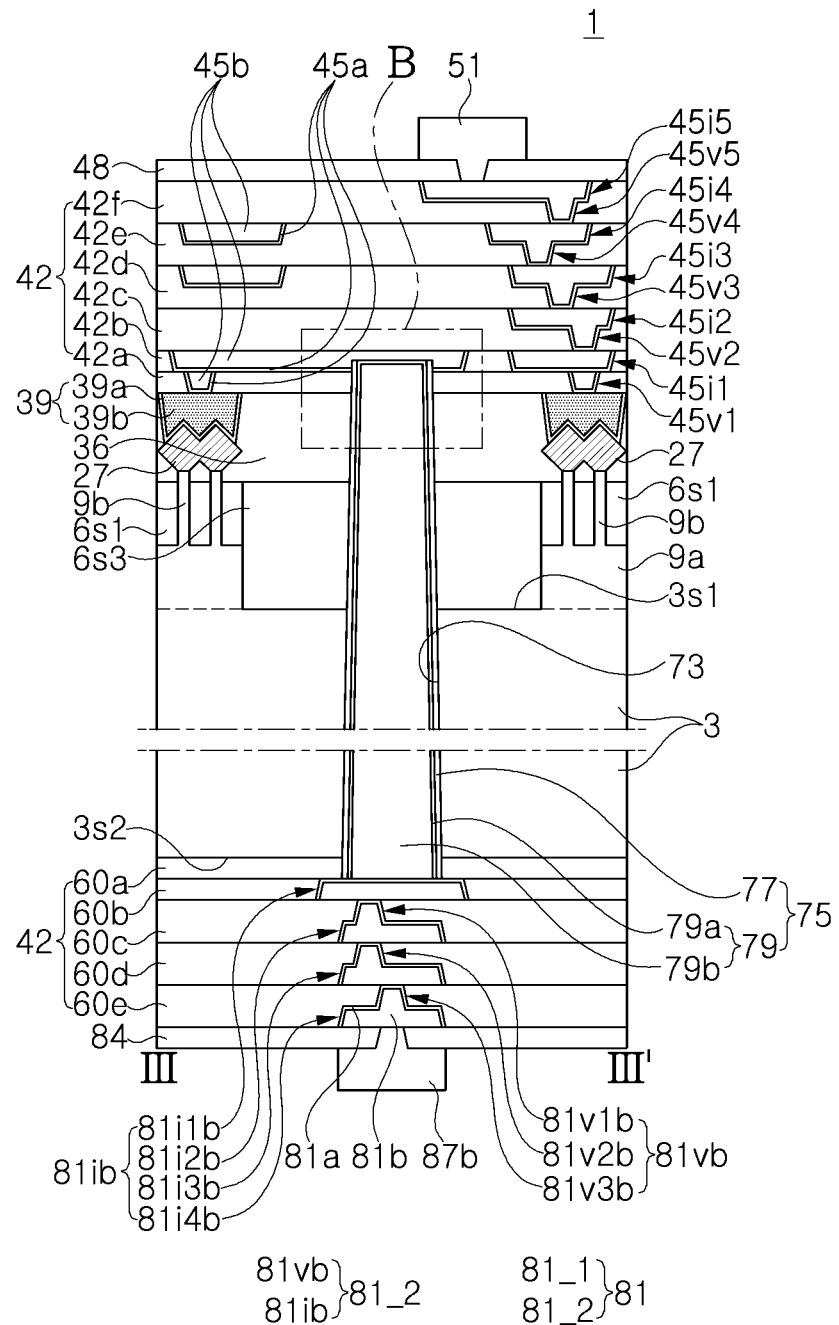
FIG. 3A is a cross-sectional view of a semiconductor device taken along line III-III' of FIG. 1B according to an embodiment of the present disclosure.
Figure 3B:
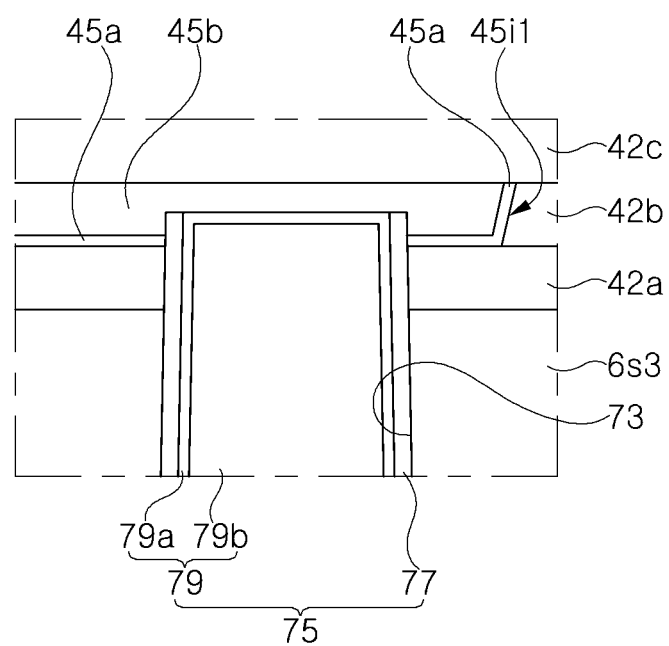
FIG. 3B is a partially enlarged view of portion B of FIG. 3A according to an embodiment of the present disclosure.

A semiconductor device according to an embodiment will be described with reference to FIGS. 1A to 3B. FIGS. 1A and 1B are schematic plan views of a semiconductor device according to an example embodiment, FIG. 2A is a cross-sectional view illustrating regions, respectively taken along lines I-I' and II-II' of FIG. 1A, FIG. 3A is a cross-sectional view illustrating a region taken along line III-III' of FIG. 1B, FIG. 2B is a partially enlarged view of portion "A" of FIG. 2A, and FIG. 3B is a partially enlarged view of portion "B" of FIG. 3A.

Referring to FIGS. 1A, 1B, 2A, and 2B, a semiconductor device 1 according to an embodiment may include a substrate 3 having a first side $3s1$ and a second side $3s2$ opposing each other, an active region 9 and an isolation region 6 on the first side $3s1$ of the substrate 3, a buried structure 14 having at least a portion disposed in the isolation region 6, a front side interconnection structure 45 on the first side $3s1$ of the substrate 3, a back side interconnection structure 81 disposed below the second side $3s2$ of the substrate 3, a first through-electrode structure 65 in a first through-hole 63 penetrating through at least a portion of the substrate 3, and a second through-electrode structure 75 in a second through-hole 73 penetrating through at least a portion of the substrate 3.

In an embodiment, the substrate 3 may be a semiconductor substrate which may be formed of a semiconductor material. For example, the substrate 3 may be a silicon semiconductor substrate. However, embodiments of the present disclosure are not limited thereto. For example, in an embodiment, the substrate 3 may be a compound semiconductor substrate.

The isolation region 6 may include a first isolation layer $6s1$ on a first region R1 of the substrate 3, a second isolation layer $6s2$ on a second region R2 of the substrate 3, and a third isolation layer $6s3$ on a third region R3 of the substrate 3.

In the substrate 3, the second region R2 may be disposed between first portions R1$a$ and R1$b$ of the first region R1 spaced apart from each other (e.g., in the Y direction). In the substrate 3, the third region R3 may be disposed between second portions R1$c$ and R1$d$ of the first region R1 spaced apart from each other (e.g., in the Y direction).

In an embodiment, the active region 9 may be disposed on the first region R1 of the substrate 3. The active region 9 may include a base region 9$a$ and an active fin 9$b$ on the base region 9$a$. The active region 9 may extend from the substrate 3 in a vertical direction Z. The vertical direction Z may be perpendicular to the second side $3s2$ of the substrate 3.

The first isolation layer $6s1$ may define at least a portion of the active region 9. For example, the first isolation layer $6s1$ may define at least a portion of the active fin 9$b$ on the base region 9$a$. For example, the first isolation layer $6s1$ may cover at least a portion of a lateral side surface of the active fin 9$b$.

In an embodiment, the base region 9$a$ may be referred to as a lower active fin extending from the second side $3s2$ of the substrate 3 in the vertical direction Z, and the active fin 9$b$ may be referred to as an upper active fin extending from the base region 9$a$, for example, the lower active fin in the vertical direction Z.

The second and third isolation layers $6s2$ and $6s3$ may define a lateral side surface of the base region 9$a$, and may define a lateral side surface of a structure including the first isolation layer 6s1 and the active fin 9b.

In an embodiment, a distance (e.g., a length in a thickness direction of the substrate 3) between a lower surface of the first isolation layer 6s1 and the second side 3s2 of the substrate 3 may be greater than a distance (e.g., a length in a thickness direction of the substrate 3) between a lower surface of each of the second and third isolation layers 6s2 and 6s3 and the second side 3s2 of the substrate 3.

At least a portion of the buried structure 14 may be disposed on the first side 3s1 of the substrate 3. The buried structure 14 may include a portion, disposed in the isolation region 6, and a portion disposed in the substrate 3 below the isolation region 6. The buried structure 14 may be disposed in a trench 12 penetrating through the second isolation layer 6s2 of the isolation region 6 and extending inwardly of the substrate 3.

In an embodiment, the buried structure 14 may include a conductive line 18 and an insulating liner 15 in direct contact with at least a portion of a lateral side surface of the conductive line 18. The buried structure 14 may further include an insulating capping pattern 21 disposed on the conductive line 18 in the trench 12, such as on an upper surface of the conductive line 18.

In an embodiment, the conductive line 18 may include a conductive pattern 18b and a conductive liner 18a covering lateral side surfaces and a portion of a lower surface of the conductive pattern 18b. The insulating liner 15 may cover a lateral side surface of the conductive line 18, and may cover a portion of a lower surface of the conductive line 18.

At least a portion of the conductive line 18 may be disposed in the second isolation layer 6s2. An upper surface of the conductive line 18 may be disposed on a level lower than a level of an upper surface of the isolation region 6, such as an upper surface of the second isolation layer 6s2, and may be disposed on a level higher than that of a lower surface of the second isolation layer 6s2. A lower surface of the conductive line 18 may be disposed on a level lower than a level of a lower surface of the isolation region 6, for example, a lower surface of the second isolation layer 6s2. The conductive line 18 may be disposed on a level lower than a level of an upper end of the active region 9. The conductive line 18 may be disposed on a level lower than a level of the first front side interconnection layer 45i1.

The semiconductor device 1 may further include a circuit device TR disposed on the active region 9, on the first side 3s1 of the substrate 3.

The circuit device TR may include a transistor having a gate 30, intersecting the active fin 9b, and source/drain regions 27 on the active fin 9b. The transistor of the circuit device TR may be a fin field effect transistor (FinFET).

In an embodiment, the transistor of the circuit device TR may be a transistor having a multi-bridge channel FET (MBCFET™) structure, a gate-all-around field effect transistor. For example, the circuit device TR may further include a plurality of channel layers 24 spaced apart from each other in the vertical direction Z on the active fin 9b and disposed between the source/drain regions 27 (e.g., in the X direction). The gate 30 may surround each of the plurality of channel layers 24 while intersecting the active fin 9b. In an embodiment, the plurality of channel layers 24 may include three channel layers. However, embodiments of the present disclosure are not limited thereto and the number of the plurality of channel layers 24 may vary. For example, the plurality of channel layers 24 may include four or more channel layers.

The semiconductor device 1 may further include a gate capping layer 33 on the gate 30. For example, in an embodiment a lower surface of the gate capping layer 33 may directly contact an upper surface of the gate 30.

The semiconductor device 1 may include an interlayer insulating layer 36 covering at least one side of the circuit device TR. The interlayer insulating layer 36 may cover the isolation region 6.

The semiconductor device 1 may further include a contact plug 39 electrically connected to the circuit device TR. For example, in an embodiment, the contact plug 39 may be provided as a plurality of contact plugs 39, and at least some of the plurality of contact plugs 39 may penetrate through the interlayer insulating layer 36 to directly contact the source/drain regions 27.

The semiconductor device 1 may further include contact plugs 39. Some of the contact plugs 39 may penetrate through the interlayer insulating layer 36 to directly contact the source/drain regions 27. Each of the contact plugs 39 may include a conductive pattern 39b and a conductive liner 39a covering lateral side surfaces and lower surfaces of the conductive pattern 39b. For example, in an embodiment, the conductive liner 39a may include at least one compound selected from Ta, TaN, Mn, MnN, WN, Ti, and TiN, and the conductive pattern 39b may include at least one compound selected from Co, Mo, Ru, and W. However, embodiments of the present disclosure are not limited thereto and the conductive liner 39a may include other materials.

The semiconductor device 1 may further include an intermetallic insulating structure 42. In an embodiment, the intermetallic insulating structure 42 may include first to sixth intermetallic insulating layers 42a, 42b, 42c, 42d, 42e, and 42f sequentially stacked. The first intermetallic insulating layer 42a may cover the interlayer insulating layer 36 and the contact plugs 39. However, embodiments of the present disclosure are not limited thereto and the number of the plurality of intermetallic insulating layers of the intermetallic insulating structure may vary.

The front side interconnection structure 45 may include a plurality of front side interconnection layers 45i, disposed on different levels from each other (e.g., distances from the first side 3s1 of the substrate 3 in a thickness direction of the substrate 3), and front side vias 45v electrically connecting the plurality of front side interconnection layers 45i to each other. In an embodiment, the front side interconnection structure 45 may include at least one of a single damascene structure and a dual damascene structure.

A "single damascene structure" may refer to a structure in which an interconnection layer or a via penetrates through an insulating layer, and a "dual damascene structure" refer to a structure in which a structure, including an interconnection layer and a via extending downwardly from the interconnection layer and formed to be integrated with the interconnection structure, penetrates through an insulating layer.

The front side interconnection structure 45 may include a first front side via 45v1 having a single damascene structure and penetrating through the first intermetallic insulating layer 42a, a first front side interconnection layer 45i1 having a single damascene structure and penetrating through the second intermetallic insulating layer 42b, a second via 45v2 and a second front side interconnection layer 45i2 having a dual damascene structure, penetrating through the third intermetallic insulating layer 42c, and formed to be integrated with each other, a third via 45v3 and a third front side interconnection layer 45i3 having a dual damascene structure, penetrating through the fourth intermetallic insulating layer 42d, and formed to be integrated with each other, a fourth via 45v4 and a fourth front side interconnection layer 45i4 having a dual damascene structure, penetrating through the fifth intermetallic insulating layer 42e, and formed to be integrated with each other, and a fifth via 45v5 and a fifth front side interconnection layer 45i5 having a dual damascene structure, penetrating through the sixth intermetallic insulating layer 42f, and formed to be integrated with each other. In this embodiment, the single damascene structure and the dual damascene structure are provided to describe examples of the front side interconnection structure 45. However, embodiments of the present disclosure are not limited thereto. Among the dual damascene structures, a dual damascene structure, for example, in an embodiment, the fifth via 45v5 and the fifth front side interconnection layer 45i5 may be modified to have a single damascene structure, respectively. In addition, in an embodiment, each of the first front side via 45v1 having a single damascene structure and the first front side interconnection layer 45i1 having a single damascene structure may be modified to have a dual damascene structure.

The first front side interconnection layer 45i1 may be disposed on a level higher than a level of the buried structure 14.

Each of the damascene structures of the front side interconnection structure 45 may include a conductive pattern 45b and a conductive liner 45a covering a lower surface and lateral side surfaces of the conductive pattern 45b. For example, the first front side interconnection layer 45i1 may include a conductive pattern 45b and a conductive liner 45a covering the lower surface and the lateral side surfaces of the conductive pattern 45b, and the second via 45v2 and the second front side interconnection layer 45i2 may be integrally formed to have a dual damascene structure, and may include a conductive pattern 45b and a conductive liner 45a covering the lower surface and lateral side surfaces of the conductive pattern 45b. The conductive liner 45a may include a conductive barrier layer and a metal seed layer, and the conductive pattern 45b may include a metal. For example, in an embodiment, the conductive liner 45a may include a metal nitride (e.g., titanium nitride (TiN), or the like), and the conductive pattern 45b may include a metal (e.g., copper (Cu), or the like). However, embodiments of the present disclosure are limited thereto, and the conductive liner 45a and the conductive pattern 45b may include other materials.

The semiconductor device 1 may further include a front side insulating capping layer 48 disposed on the intermetallic insulating structure 42 and the front side interconnection structure 45.

In an embodiment, the semiconductor device 1 may further include a front pad 51 having at least a portion penetrating through the front side insulating capping layer 48 and electrically connected to the front side interconnection structure 45. For example, when the semiconductor device 1 further includes the front pad 51, the semiconductor device 1 may constitute a semiconductor package, together with a base substrate (see 800 of FIG. 15) disposed below the semiconductor device 1 and an upper semiconductor device (see 900 of FIG. 15) disposed above the semiconductor device 1.

However, embodiments of the present disclosure are not limited thereto. For example, in an embodiment, the front pad 51 may be omitted. In an embodiment in which the front pad 51 is omitted, the semiconductor device 1 may constitute a semiconductor package, together with a base substrate (see 800 of FIG. 15) disposed below the semiconductor device 1.

The semiconductor device 1 may further include a back side insulating structure 60. The back side insulating structure 60 may include a first back side insulating layer 60a covering the second side 3s2 of the substrate 3, a second back side insulating layer 60b below the first back side insulating layer 60a, a third back side insulating layer 60c below the second back side insulating layer 60b, a fourth back side insulating layer 60d below the third back side insulating layer 60c, and a fifth back side insulating layer 60e below the fourth back side insulating layer 60d.

The back side interconnection structure 81 may include a first back side interconnection structure 81_1 and a second back side interconnection structure 81_2.

Each of the first and second back side interconnection structures 81_1 and 81_2 may include a plurality of back side interconnection layers 81ia and 81ib, disposed on different height levels, and back side vias 81va and 81vb electrically connected to the plurality of back side interconnection layers 81ia and 81ib.

In an embodiment, each of the first and second back side interconnection structures 81_1 and 81_2 may include at least one of a single damascene structure and a dual damascene structure. For example, each of the first and second back side interconnection structures 81_1 and 81_2 may include first back side interconnection layers 81ia and 81ib having a single damascene structure and penetrating through the second back side insulating layer 60b, first back side vias 81va and 81vb and second back side interconnection layers 81i2a and 81i2b having a dual damascene structure and penetrating through the third back side insulating layer 60c, second back side vias 81v2a and 81v2b and third back side interconnection layers 81i3a and 81i3b having a dual damascene structure and penetrating through the fourth back side insulating layer 60d, and third back side vias 81v3a and 81v3b and fourth back side interconnection layers 81i4a and 81i4b having a dual damascene structure and penetrating through the fifth back side insulating layer 60e. However, embodiments of the present disclosure are not limited thereto.

When viewed based on a cross-sectional structure of FIG. 2A, in each of the first and second back side interconnection structures 81_1 and 81_2, at least one of the single damascene structure and the dual damascene structure may include an interconnection layer 81b and a barrier layer 81a covering an upper surface and lateral side surfaces of the interconnection layer 81b. In an embodiment, the barrier layer 81a may include at least one compound selected from Ta, TaN, Mn, MnN, WN, Ti, and TiN, and the interconnection layer 81b may include at least one compound selected from Cu, Co, Mo, Ru, and W. However, embodiments of the present disclosure are not limited thereto, and the barrier layer 81a and the interconnection layer 81b may include other materials.

In each of the first and second back side interconnection structures 81_1 and 81_2, the first back side vias 81v1a and 81v1b may be formed to be integrated with the second back side interconnection layers 81i2a and 81i2b, and may directly contact the first back side interconnection layers 81i1a and 81i1b. The second back side vias 81v2a and 81v2b may be formed to be integrated with the third back side interconnection layers 81i3a and 81i3b, and may directly contact the second back side interconnection layers 81i2a and 81i2b. The third back side vias 81v3a and 81v3b may be formed to be integrated with the fourth back side interconnection layers 81*i*4*a* and 81*i*4*b*, and may directly contact the third back side interconnection layers 81*i*3*a* and 81*i*3*b*. The semiconductor device 1 may further include a back side insulating capping layer 84 disposed below the back side insulating structure 60 and the back side interconnection structure 81.

The semiconductor device 1 may further include back side pads each having at least a portion penetrating through the back side insulating capping layer 84, and electrically connected to the back side interconnection structure 81. The back side pads may include a first back side pad 87*a*, electrically connected to the first back side interconnection structure 81_1, and a second back side pad 87*b* electrically connected to the second back side interconnection structure 81_2.

The first through-electrode structure 65 may be disposed between the conductive line 18 and the first back side interconnection structure 81_1. The first through-electrode structure 65 may directly contact the conductive line 18 and may extend downwardly to sequentially penetrate through the substrate 3 and the first back side insulating layer 60*a* and to be electrically connected to the first back side interconnection structure 81_1. The first through-electrode structure 65 may include a first through-electrode 69 and a first insulating spacer 67 on lateral side surfaces of the first through-electrode 69. An upper surface of the first through-electrode 69 may directly contact the conductive line 18, and a lower surface of the first through-electrode 59 may directly contact the first back side interconnection layer 81*i*1*a* of the first back side interconnection structure 811.

The upper surface of the first through-electrode 69 may be disposed on a level higher than a level of a lower surface of the conductive line 118.

The first through-electrode 69 may include a conductive pattern 69*b* and a conductive liner 69*a* covering lateral side surfaces and an upper surface of the conductive pattern 69*b*. The conductive liner 69*a* of the first through-electrode 69 may directly contact the conductive line 18. In the first through-electrode 69, a lower end of the conductive liner 69*a* and a lower surface of the conductive pattern 69*b* may directly contact the first back side interconnection layer 81*i*1*a* of the first back side interconnection structure 81_1.

An upper surface of the first through-electrode structure 65 may be disposed on a level lower than a level of the first side 3*s*1 of the substrate 3. An upper surface of the first through-electrode structure 65 may be disposed on a level lower than a level of the isolation region 6.

The second through-electrode structure 75 may penetrate through the first back side insulating layer 60*a*, the substrate 3, the interlayer insulating layer 36, and the first intermetallic insulating layer 42*a* between the front side interconnection structure 45 and the second back side interconnection structure 81_2. For example, a portion of the second through-electrode structure 75 may penetrate through the third isolation layer 6*s*3. The second through-electrode structure 75 may include a second through-electrode 79 and a second insulating spacer 77 on lateral side surfaces of the second through-electrode 79.

An upper surface of the second through-electrode 79 may directly contact one of the front side interconnection layers 45*i* of the front side interconnection structure 45, for example, the first front side interconnection layer 45*i*1. A lower surface of the second through-electrode 79 may directly contact the first back side interconnection layer 81*i*1*b* of the second back side interconnection structure 81_2.

The second through-electrode 79 may include a conductive pattern 79*b* and a conductive liner 79*a* covering lateral side surfaces and an upper surface of the conductive pattern 79*b*. The conductive liner 79*a* of the second through-electrode 79 may directly contact the first front side interconnection layer 45*i*1. In the second through-electrode 79, a lower end of the conductive liner 79*a* and a lower surface of the conductive pattern 79*b* may directly contact the first back side interconnection layer 81*i*1*b* of the second back side interconnection structure 81_2.

A width of the second through-electrode structure 75 may be greater than a width of the first through-electrode structure 65. A width of the second through-electrode 79 may be greater than a width of the first through-electrode 69. In an embodiment, a lower surface of the first through-electrode 69 and a lower surface of the second through-electrode 79 may be disposed on substantially the same level. An upper surface of the second through-electrode 79 may be disposed on a level higher than a level of an upper surface of the first through-electrode 69.

In an embodiment, the number of the plurality of front side interconnection layers 45*i* disposed on different height levels may be 'n,' and the number of the plurality of back side interconnection layers disposed on different height levels may be 'm' which is greater than or equal to 'n/2.'

In an embodiment, 'n' may be a positive integer greater than or equal to 4.

In an embodiment, 'm' may be a positive integer smaller than or equal to 'n.'

In an embodiment, 'm' may be greater than 'n.'

For example, in an embodiment, 'm' may be a positive integer greater than or equal to 2.

In an embodiment, 'm' may be a positive integer greater than or equal to 3.

In an embodiment, 'm' may be a positive integer greater than or equal to 4.

In an embodiment, the conductive line 18 and the first back side interconnection layer 81*i*1*a* of the first back side interconnection structure 81_1 may be arranged in the form of lines extending longitudinally in the same direction, for example, the first direction X. The first direction X may be parallel to the second side 3*s*2 of the substrate 3. The conductive line 18 may overlap the first back side interconnection layer 81*i*1*a* of the first back side interconnection structure 81_1 (e.g., in a thickness direction of the substrate 3). In an embodiment, a width of the first back side interconnection layer 81*i*1*a* of the first back side interconnection structure 81_1 may be greater than a width of the conductive line 18.

In an embodiment, the first back pad 87*a*, the first back side interconnection structure 81_1, and the first through-electrode 69 may be a power transmission path, and the second back pad 87*b*, the second back side interconnection structure 81_2 and the second through-electrode 79 may be an input/output transmission path.

In an embodiment, a plurality of first through-electrodes 69 may be disposed to directly contact a single conductive line 18. Due to the plurality of first through-electrodes 69 which may be disposed to directly contact the single conductive line 18, the power transmission path may have an increased electrical performance.

In an embodiment, the second through-electrode 79 may be formed to be larger than the first through-electrodes 69. Due to the second through-electrode 79 which may be formed to be larger, electrical performance of the input/output transmission path may be increased.

In an embodiment, a plurality of second through-electrodes 79 may be disposed to directly contact a single first front side interconnection layer 45i1. Due to the plurality of the second through-electrodes 79 which may be formed to directly contact the single first front side interconnection layer 45i1, the input/output transmission path may have increased electrical performance.

Accordingly, electrical performance of the semiconductor device 1, for example, performance of the semiconductor device 1 may be increased.

According to an embodiment, a plurality of front side interconnection layers 45i having different height levels may be disposed on the first side 3s1 of the substrate, a plurality of back side interconnection layers 81ia and 81ib having different height levels may be disposed on a second side 3s2 of the substrate, and the first interconnection layers having different sizes may be disposed on the first side 3s1 of the substrate, so that the integration density of the semiconductor device 1 may be increased and a size of the semiconductor device 1 may be decreased. The first and second through-electrodes 69 and 79 may be provided to have various widths and/or heights, so that the semiconductor device 1 having increased performance may be provided.

In the description below, various modified examples of the semiconductor device 1 according to an embodiment of the present disclosure will be described. Among the components of the semiconductor device 1, the components which may be modified or replaced will be mainly described, and the other components will not be described or will be described along with the components modified by being directly referred to and a repeated description of similar or identical elements may be omitted for convenience of explanation.

Figure 4A:
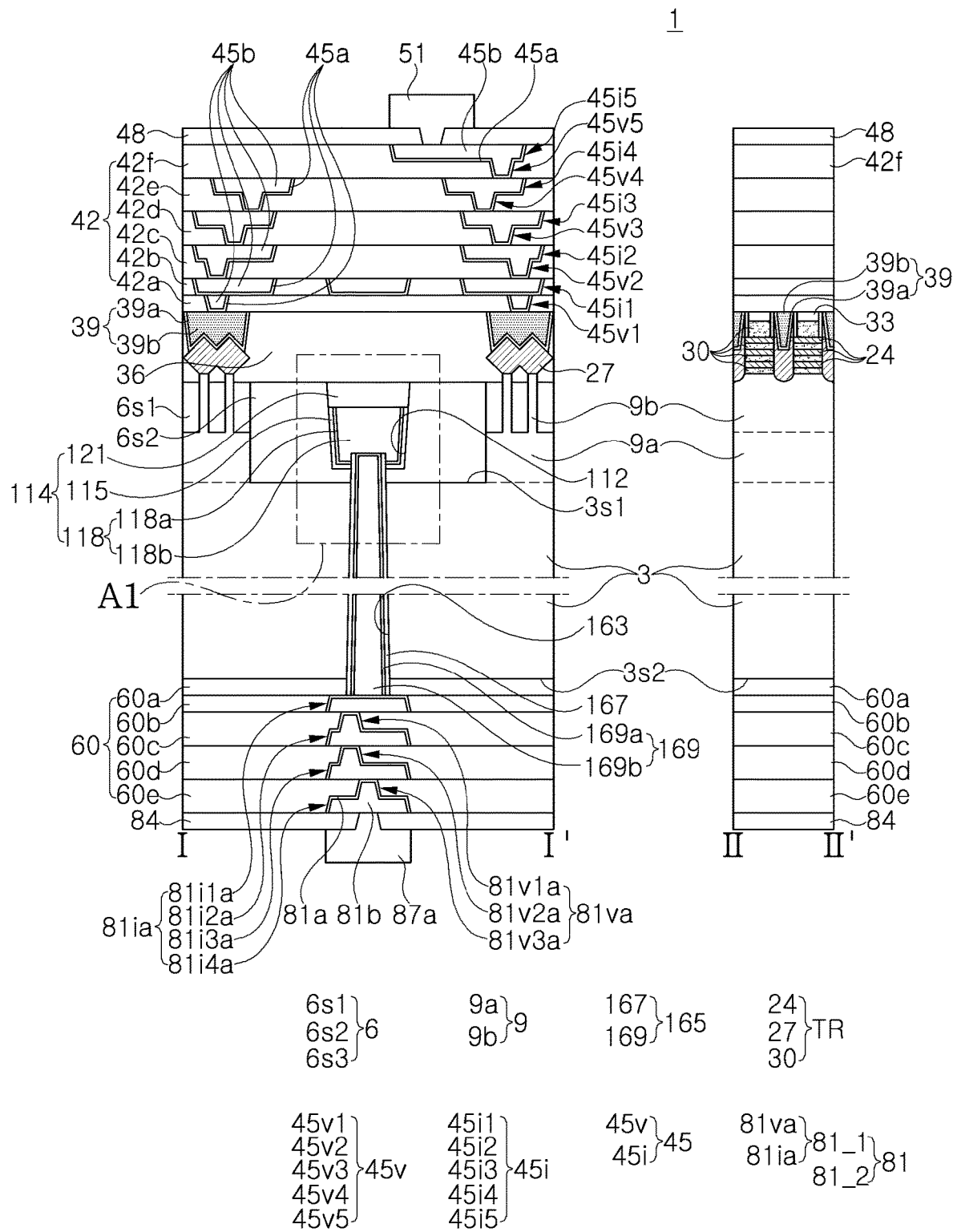
FIGS. 4A, 5A, 7A and 9A are cross-sectional views of a semiconductor device taken along lines I-I' and II-II' of FIG. 1A according to embodiments of the present disclosure.
Figure 4B:
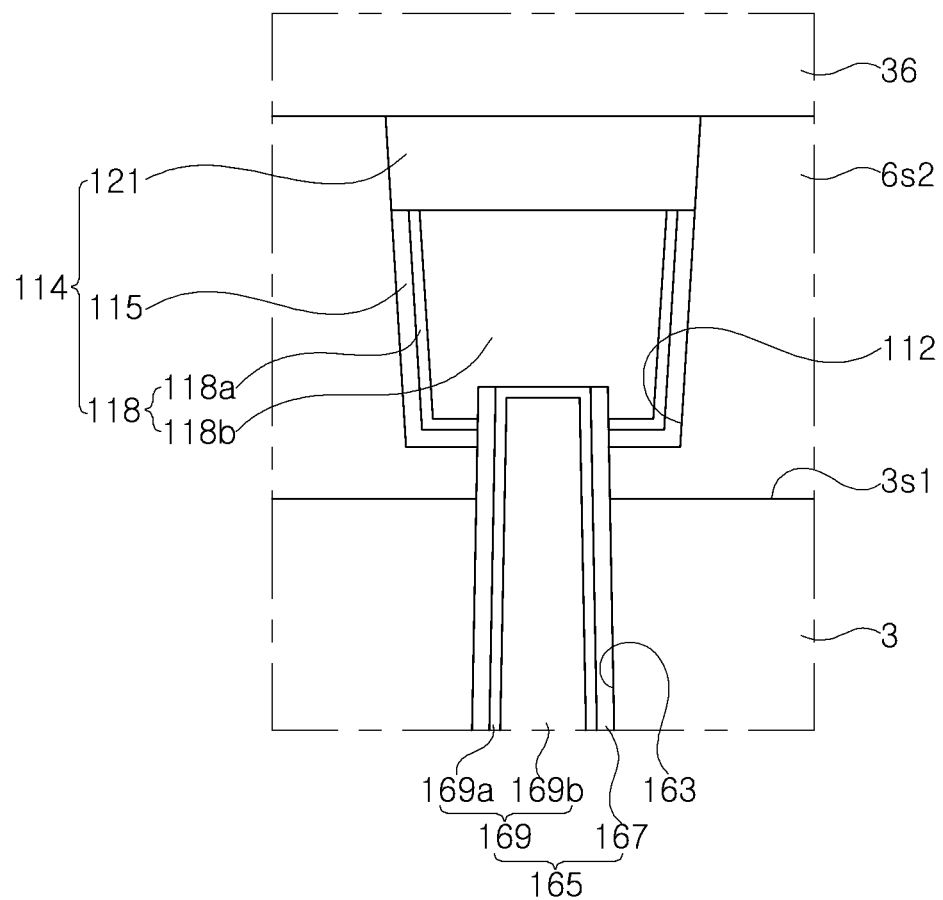
FIG. 4B is a partially enlarged view of region A1 of FIG. 4A according to an embodiment of the present disclosure.
Figure 5A:
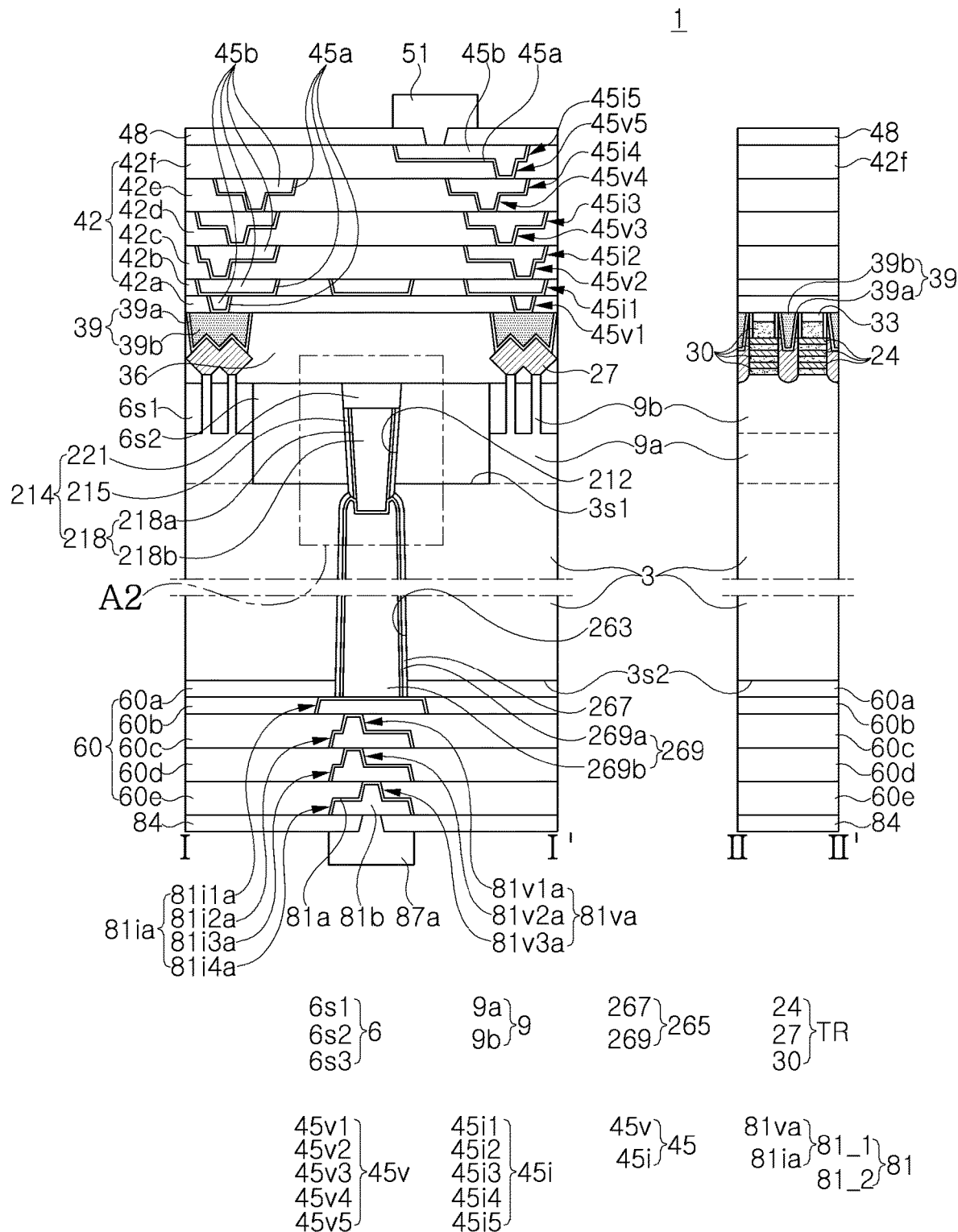
Figure 5B:
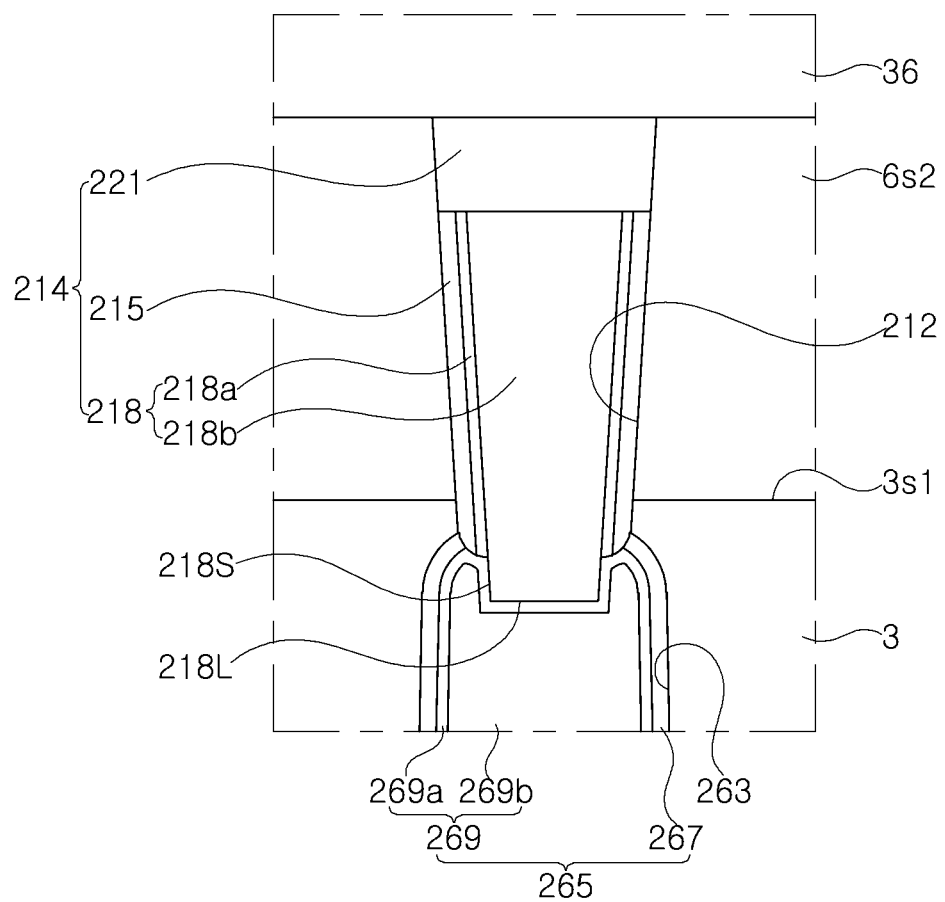
FIGS. 5B and 6 are partially enlarged views of region A2 of FIG. 5A according to embodiments of the present disclosure.
Figure 6:
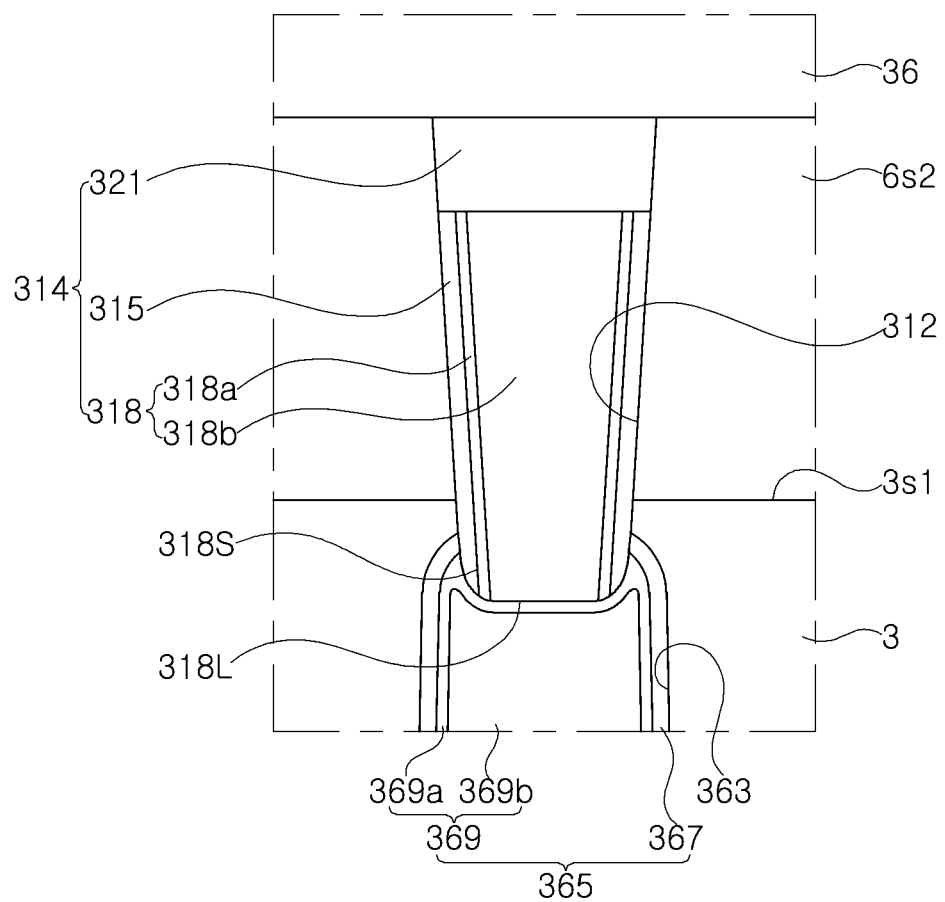
Figure 7A:
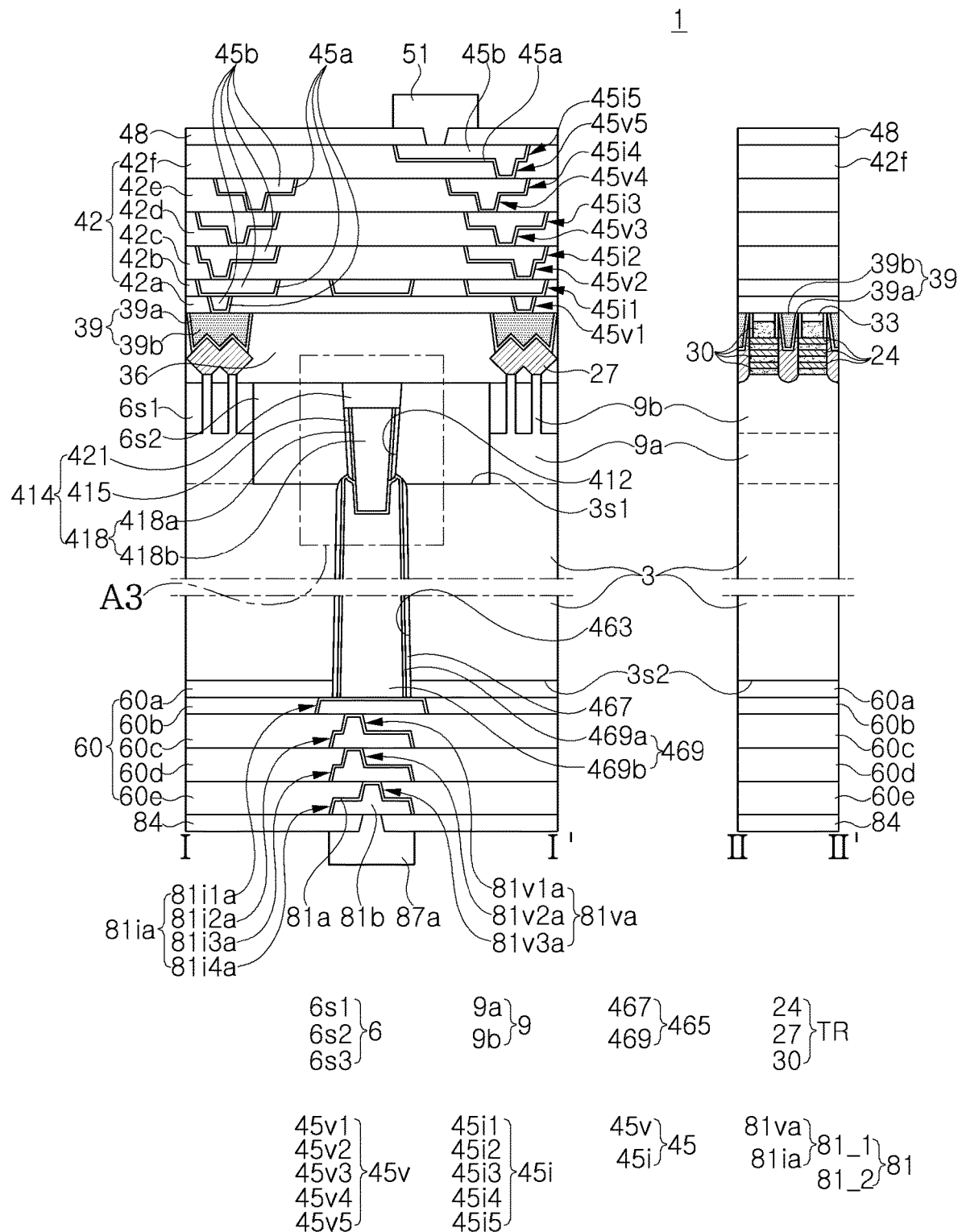
Figure 7B:
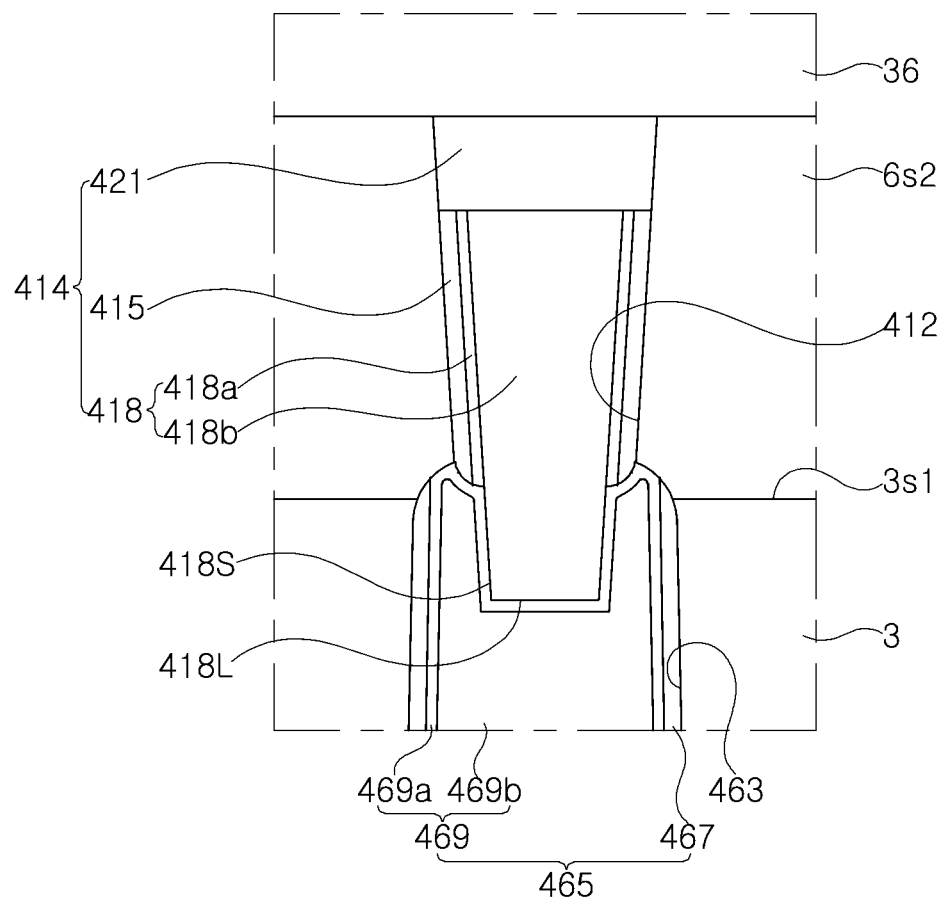
FIGS. 7B and 8 are partially enlarged views of region A3 of FIG. 7A according to embodiments of the present disclosure.
Figure 8:
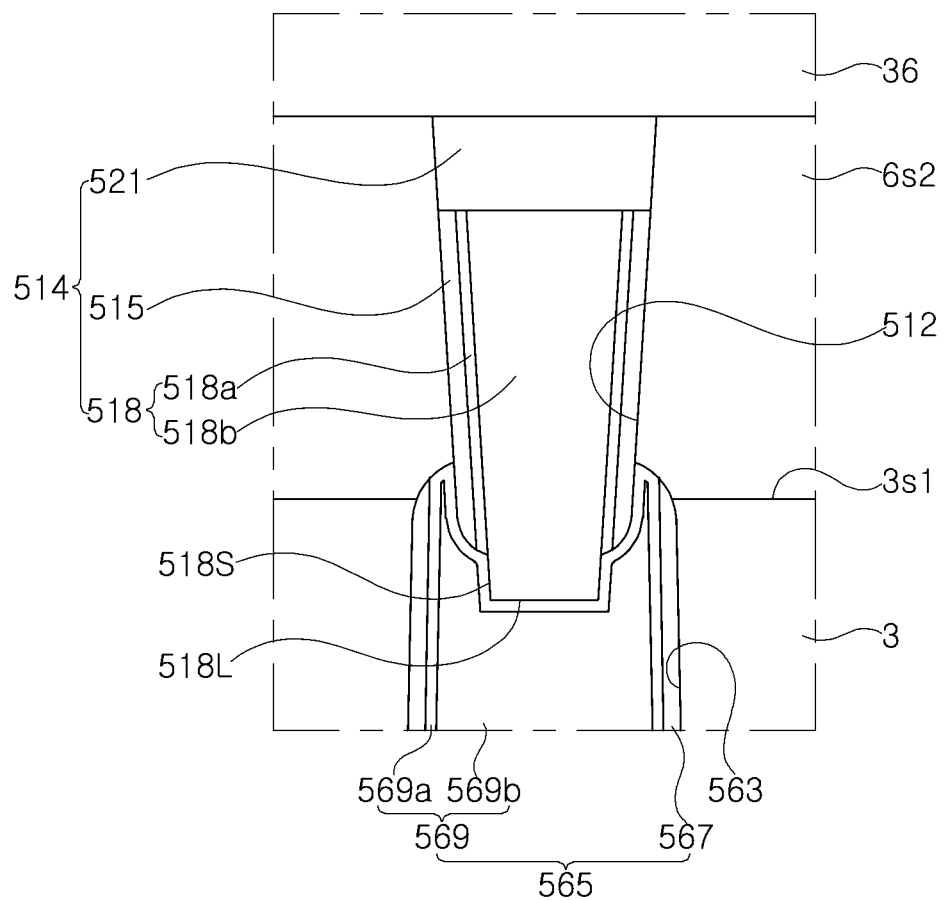
Figure 9A:
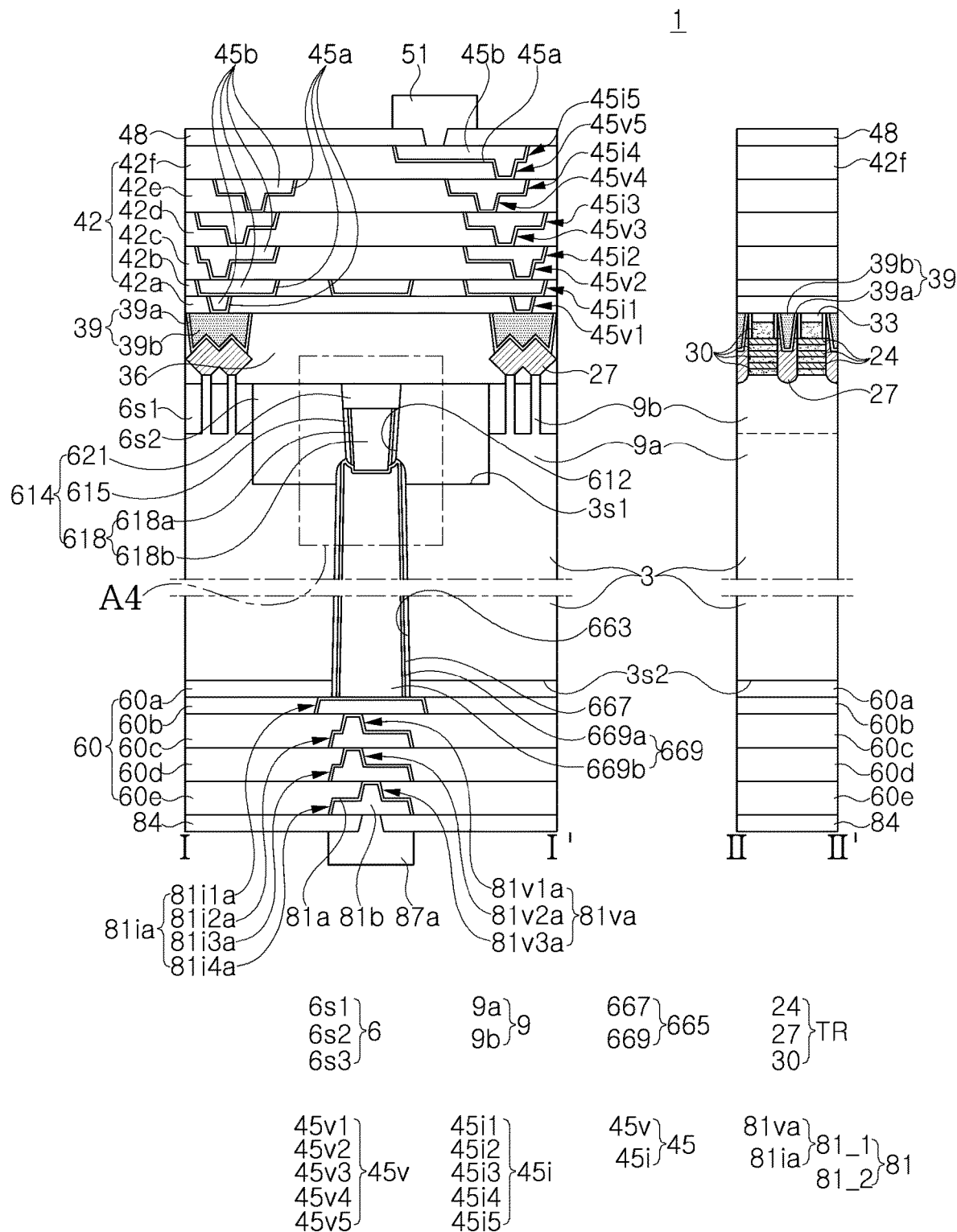
Figure 9B:
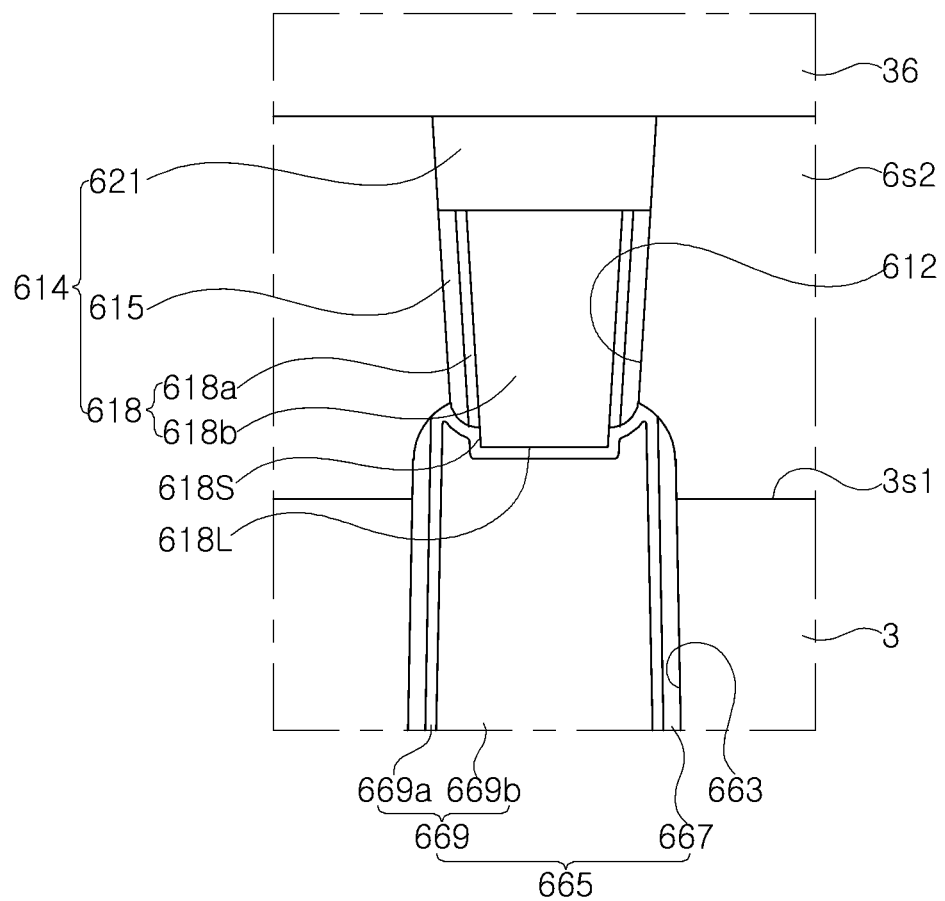
FIG. 9B is a partially enlarged views of region A4 of FIG. 9A according to an embodiment of the present disclosure.

FIGS. 4A to 9B are views illustrating various embodiments of the buried structure 14 and the first through-electrode structure 65. Specifically, FIG. 4A is a cross-sectional view illustrating an embodiment of the buried structure 14 and the first through-electrode structure 65 of FIG. 2A, FIG. 4B is a partially enlarged view of region "A1" of FIG. 4A, FIG. 5A is a cross-sectional view illustrating a modified example of the buried structure 14 and the first through-electrode structure 65 of FIG. 2A, FIG. 5B is a partially enlarged view of region "A2" of FIG. 5A, FIG. 6 is a view illustrating a modified example of the buried structure 14 and the first through-electrode structure 65 in a partially enlarged view corresponding to FIG. 5B, FIG. 7A is a cross-sectional view illustrating a modified example of the buried structure 14 and the first through-electrode structure 65 of FIG. 2A FIG. 7B is a partially enlarged view of region "A3" of FIG. 7A, FIG. 8 is a view illustrating a modified example of the buried structure 14 and the first through-electrode structure 65 in a partially enlarged view corresponding to FIG. 7B, FIG. 9A is a cross-sectional view illustrating a modified example of the buried structure 14 and the first through-electrode structure 65 of FIG. 2A, and FIG. 9B is a partial enlarged view of region "A4" of FIG. 9A.

In an embodiment, referring to FIGS. 4A and 4B, the buried structure 14 described in FIGS. 2A and 2B may be replaced with a buried structure 114 having a lower surface that is disposed on a level that is higher than a level of the first side 3s1 of the substrate 3 as illustrated in FIGS. 4A and 4B, and the first through-electrode structure 65 described in FIGS. 2A and 2B may be replaced with the first through-electrode structure 165 having an upper surface disposed on a level higher than a level of the first side 3s1 of the substrate 3 as illustrated in FIGS. 4A and 4B.

The buried structure 114 may be disposed in the trench 112 disposed in the second isolation layer 6s2. The buried structure 114 may include a conductive line 118, an insulating liner 115 covering a portion of a lower surface of the conductive line 118 and lateral side surfaces of the conductive line 118, and an insulating capping pattern 121 disposed on the conductive line 118, such as on an upper surface of the conductive line 118. The conductive line 118 may include a conductive pattern 118b and a conductive liner 118a covering a portion of a lower surface of the conductive pattern 118b and lateral side surfaces of the conductive pattern 118b.

The first through-electrode structure 165, which may be disposed in a first through-hole 163 penetrating through at least a portion of the substrate 3, may penetrate through the substrate 3 and may penetrate through a portion of the second isolation layer 6s2 to directly contact the conductive line 118.

The first through-electrode structure 165 may include a first through-electrode 169 and a first insulating spacer 167 on lateral side surfaces of the first through-electrode 169. The first through-electrode 169 may include a conductive pattern 169b and a conductive liner 169a covering lateral side surfaces and an upper surface of the conductive pattern 169b.

A lower surface of the conductive line 118 and an upper surface of the first through-electrode 169 may be disposed on a level higher than a level of a lower surface of the isolation region 6, such as a lower surface of the second isolation layer 6s2. An upper surface of the first through-electrode 169 may directly contact the conductive line 118, and may be disposed on a level higher than a level of a lower surface of the second isolation layer 6s2 and a lower surface of the conductive line 118.

In an embodiment, referring to FIGS. 5A and 5B, the buried structure 14 described in FIGS. 2A and 2B may be replaced with a buried structure 214 described as in FIGS. 5A and 5B, and the first through-electrode structure 65 described in FIGS. 2A and 2B may be replaced with the first through-electrode structure 265 as illustrated in FIGS. 5A and 5B.

The buried structure 214 may be disposed in a trench 212 penetrating through the second isolation layer 6s2 and extending inwardly of the substrate 3. The buried structure 214 may include a conductive line 218, an insulating liner 215 covering a portion of the lateral side surfaces of the conductive line 218, and an insulating capping pattern 221 on the conductive line 218, such as on an upper surface of the conductive line 218. The conductive line 218 may include a conductive pattern 218b and a conductive liner 218a covering a portion of lateral side surfaces of the conductive pattern 218b.

The first through-electrode structure 265 may be disposed in a first through-hole 263 penetrating through at least a portion of the substrate 3. The first through-electrode structure 265 may include a first through-electrode 269 and a first insulating spacer 267 on lateral side surfaces of the first through-electrode 269.

A width of an upper region of the first through-electrode structure 265 may be greater than a width of a lower region of the conductive line 218. A width of an upper region of the first through-electrode 269 may be greater than a width of a lower region of the conductive line 218. The first through-electrode 269 may include a conductive pattern 269b and a conductive liner 269a covering lateral side surfaces and an upper surface of the conductive pattern 269b. The first through-electrode 269 may directly contact a lower surface 218L of the conductive line 218 and at least a portion of lateral side surfaces 218S of the conductive line 218 which are not covered with the insulating liner 215.

In an embodiment, referring to FIG. 6, the buried structure 14 described in FIGS. 2A and 2B may be replaced with the buried structure 314 as illustrated in FIG. 6, and the first through-electrode structure 65 described in FIGS. 2A and 2B may be replaced with the first through-electrode structure 365 as illustrated in FIG. 6.

The buried structure 314 may be disposed in a trench 312 penetrating through the second isolation layer 6s2 and extending inwardly of the substrate 3. The buried structure 314 may include a conductive line 318, an insulating liner 315 covering lateral side surfaces 318S of the conductive line 318, and an insulating capping pattern 321 on the conductive line 318, such as on an upper surface of the conductive line 318. The conductive line 318 may include a conductive pattern 318b and a conductive liner 318a covering lateral side surfaces of the conductive pattern 318b.

The first through-electrode structure 365 may be disposed in a first through-hole 363 penetrating through at least a portion of the substrate 3. The first through-electrode structure 365 may include a first through-electrode 369 and a first insulating spacer 367 on lateral side surfaces of the first through-electrode 369.

A width of an upper region of the first through-electrode structure 365 may be greater than a width of a lower region of the conductive line 318. A width of an upper region of the first through-electrode 369 may be greater than a width of a lower region of the conductive line 318. The first through-electrode 369 may include a conductive pattern 369b and a conductive liner 369a covering lateral side surfaces and an upper surface of the conductive pattern 369b. The conductive liner 369a may directly contact a lower surface 318L of the conductive line.

In the buried structure 314, the insulating liner 315 may include a portion disposed between the conductive line 318 and the first through-electrode 369 on a level lower than a level of the first side 3s1 of the substrate 3.

In an embodiment, referring to FIGS. 7A and 7B, the buried structure 14 described in FIGS. 2A and 2B may be replaced with the buried structure 414 as illustrated in FIGS. 7A and 7B, and the first through-electrode structure 65 described in FIGS. 2A and 2B may be replaced with the first through-electrode structure 465 as illustrated in FIGS. 7A and 7B.

The buried structure 414 may be disposed in a trench 412 penetrating through the second isolation layer 6s2 and extending into the substrate 3. The buried structure 414 may include a conductive line 418, an insulating liner 415 covering a portion of lateral side surfaces 418S of the conductive line 418, and an insulating capping pattern 421 on the conductive line 418, such as on an upper surface of the conductive line 418. The conductive line 418 may include a conductive pattern 418b and a conductive liner 418a covering a portion of lateral side surfaces of the conductive pattern 418b.

The first through-electrode structure 465 may be disposed in a first through-hole 463 penetrating through the substrate 3. The first through-electrode structure 465 may include a first through-electrode 469 and a first insulating spacer 467 on lateral side surfaces of the first through-electrode 469.

A width of the upper region of the first through-electrode structure 465 may be greater than a width of the lower region of the conductive line 418. A width of an upper region of the first through-electrode 469 may be greater than a width of a lower region of the conductive line 418. The first through-electrode 469 may include a conductive pattern 469b and a conductive liner 469a covering lateral side surfaces and an upper surface of the conductive pattern 469b.

In the buried structure 414, a lower end of the insulating liner 415 may be disposed on a level higher than a level of the first side 3s1 of the substrate 3, and a lower surface 418L of the conductive line 418 may be disposed on a level lower than a level of the first side 3s1 of the substrate 3. An upper end of the first through-electrode 469 may be disposed on a level higher than a level of the first side 3s1 of the substrate 3. The first through-electrode 469 may directly contact a lower lateral side surface 418S of the conductive line 418 and an upper surface of the conductive line 418.

In an embodiment, referring to FIG. 8, the buried structure 14 described in FIGS. 2A and 2B may be replaced with the buried structure 514 as illustrated in FIG. 8, and the first through-electrode structure 65 described in FIGS. 2A and 2B may be replaced with the first through-electrode structure 565 as illustrated in FIG. 8.

The buried structure 514 may be disposed in a trench 512 penetrating through the second isolation layer 6s2 and extending inwardly of the substrate 3. The buried structure 514 may include a conductive line 518, an insulating liner 515 covering a portion of lateral side surfaces of the conductive line 518, and an insulating capping pattern 521 on the conductive line 518, such as on an upper surface of the conductive line 518. The conductive line 518 may include a conductive pattern 518b and a conductive liner 518a covering a portion of lateral side surfaces of the conductive pattern 518b.

The first through-electrode structure 565 may be disposed in a first through-hole 563 penetrating through the substrate 3. The first through-electrode structure 565 may include a first through-electrode 569 and a first insulating spacer 567 on lateral side surfaces of the first through-electrode 569.

A width of an upper region of the first through-electrode structure 565 may be wider than a width of a lower region 518L of the conductive line 518. A width of an upper region of the first through-electrode 569 may be greater than a width of a lower region 518L of the conductive line 518. The first through-electrode 569 may include a conductive pattern 569b and a conductive liner 569a covering lateral side surfaces and an upper surface of the conductive pattern 569b. The conductive liner 569a may directly contact a lower region 518L of the conductive line 518.

In the buried structure 514, the insulating liner 515 may include a portion disposed between the conductive line 518 and the first through-electrode 569 on a level lower than a level of the first side 3s1 of the substrate 3.

The first through-electrode 569 may directly contact the second isolation layer 6s2.

An upper end of the first through-electrode 569 may be disposed on a level higher than a level of a lower surface of the second isolation layer 6s2.

In an embodiment, referring to FIGS. 9A and 9B, the buried structure 14 described in FIGS. 2A and 2B may be replaced with a buried structure 614 having a lower surface disposed on a level higher than a level of the first side 3s1 of the substrate 3 as illustrated in FIGS. 9A and 9B, and the first through-electrode structure 65 described in FIGS. 2A and 2B may be replaced with the first through-electrode structure 665 having an upper surface disposed on a level higher than a level of the first side 3S1 of the substrate 3 as illustrated in FIGS. 9A and 9B.

The buried structure 614 may be disposed in the trench 612 disposed in the second isolation layer 6s2. The buried structure 614 may include a conductive line 618, an insulating liner 615 covering a portion of a lower surface 618L of the conductive line 618 and a portion of lateral side surfaces 618S of the conductive line 618, and an insulating capping pattern 621 disposed on the insulating conductive line 618, such as on an upper surface of the insulating conductive line 618. The conductive line 618 may include a conductive pattern 618*b* and a conductive liner 618*a* covering a portion of lateral side surfaces of the conductive pattern 618*b*.

The first through-electrode structure 665 may be disposed in a first through-hole 663 penetrating through the substrate 3. The first through-electrode structure 665 may penetrate through the substrate 3, and may penetrate through a portion of the second isolation layer 6*s*2 to directly contact the conductive line 618.

The first through-electrode structure 665 may include a first through-electrode 669 and a first insulating spacer 667 on lateral side surfaces of the first through-electrode 669. The first through-electrode 669 may include a conductive pattern 669*b*, and a conductive liner 669*a* covering lateral side surfaces and an upper surface of the conductive pattern 669*b*.

A width of an upper region of the first through-electrode structure 665 may be greater than a width of a lower region of the conductive line 618. A width of an upper region of the first through-electrode 669 may be greater than a width of the lower region of the conductive line 618.

A lower surface of the conductive line 618 and an upper surface of the first through-electrode 669 may be disposed on a level higher than a level of a lower surface of the second isolation layer 6*s*2.

The upper surface of the first through-electrode 669 may directly contact the conductive line 618, and may be disposed on a level higher than a level of a lower surface of the second isolation layer 6*s*2 and the lower surface of the conductive line 618.

The first through-electrode 669 may directly contact a portion of a lateral side surface of the conductive line 618 and a lower surface of the conductive line 618.

The first through-electrode 669 may directly contact the second isolation layer 6*s*2.

Figure 10:
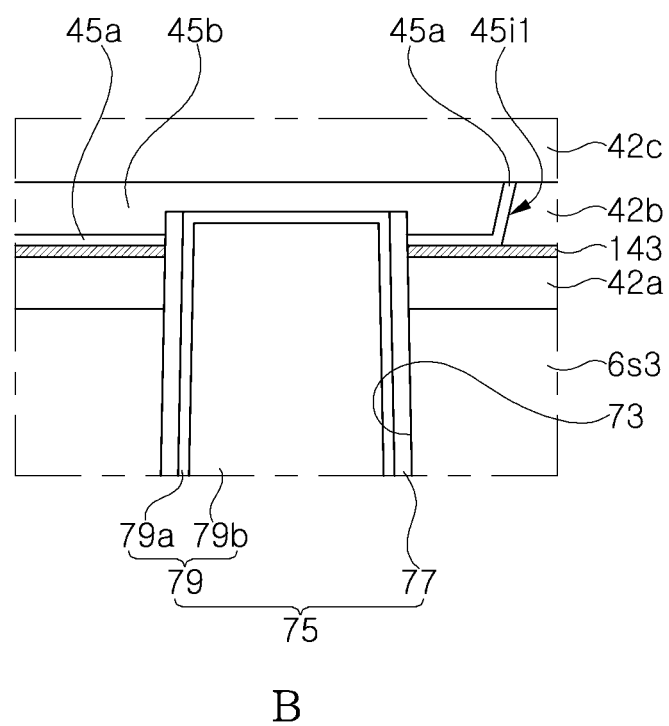
FIG. 10 is a partially enlarged view of portion B of FIG. 3A according to an embodiment of the present disclosure.

An embodiment of the semiconductor device 1 will be described with reference to FIG. 10. FIG. 10 is a view illustrating an embodiment of the semiconductor device 1, and may be a partially enlarged view corresponding to FIG. 3B.

In an embodiment, referring to FIG. 10, an insulating barrier layer 143 may be disposed between the first intermetallic insulating layer 42*a* and the second intermetallic insulating layer 42*b* (e.g., in a thickness direction of the substrate 3). The first front side interconnection layer 45*i*1 may be disposed on the insulating barrier layer 143. In an embodiment, the insulating barrier layer 143 may be formed of an insulating material that is different from the material of first and second intermetallic insulating layers 42*a* and 42*b*. For example, in an embodiment, the first and second metal insulating layers 42*a* and 42*b* may be formed of a silicon oxide or a low-k dielectric material, and an etch-stop layer includes at least one compound selected from aluminum nitride (AlN), silicon oxycarbide (SiCO), or silicon carbonitride (SiCN). The second through-electrode structure 75 may penetrate through the etch-stop layer, and may directly contact the first front side interconnection layer 45*i*1.

Figure 11:
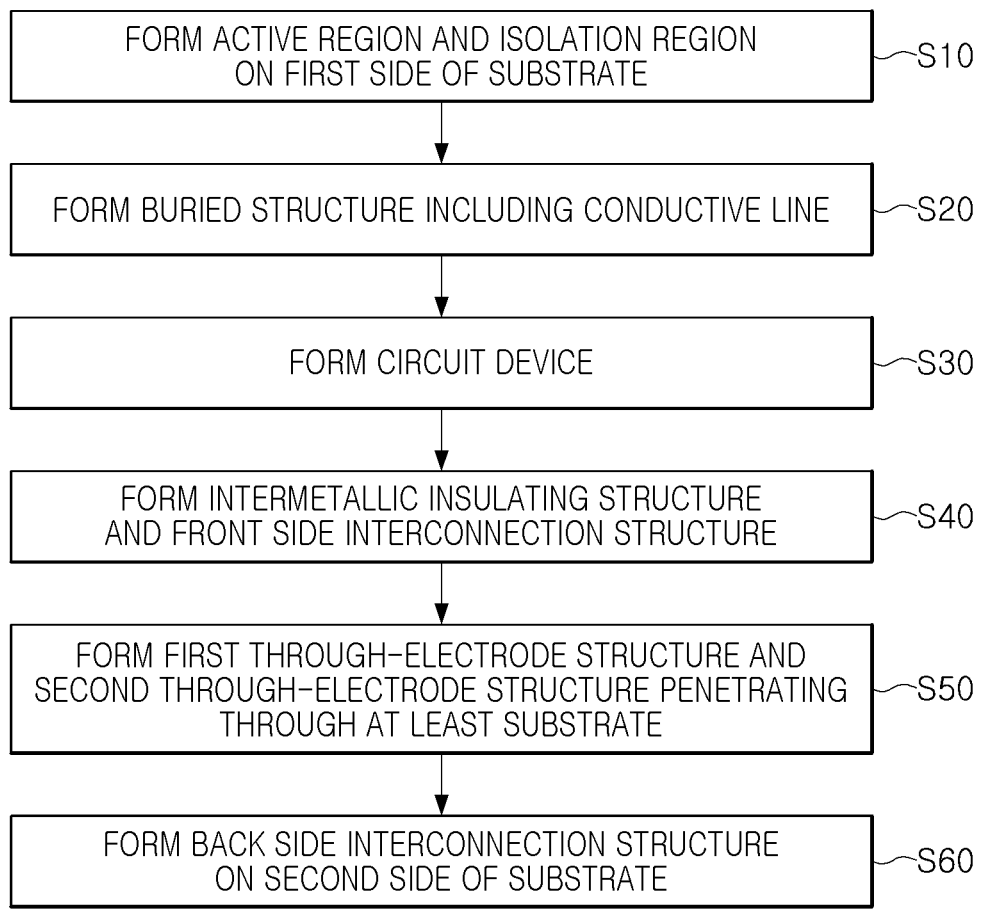
FIG. 11 is a schematic process flowchart illustrating a method of fabricating a semiconductor device according to an embodiment of the present disclosure.
Figure 12A:
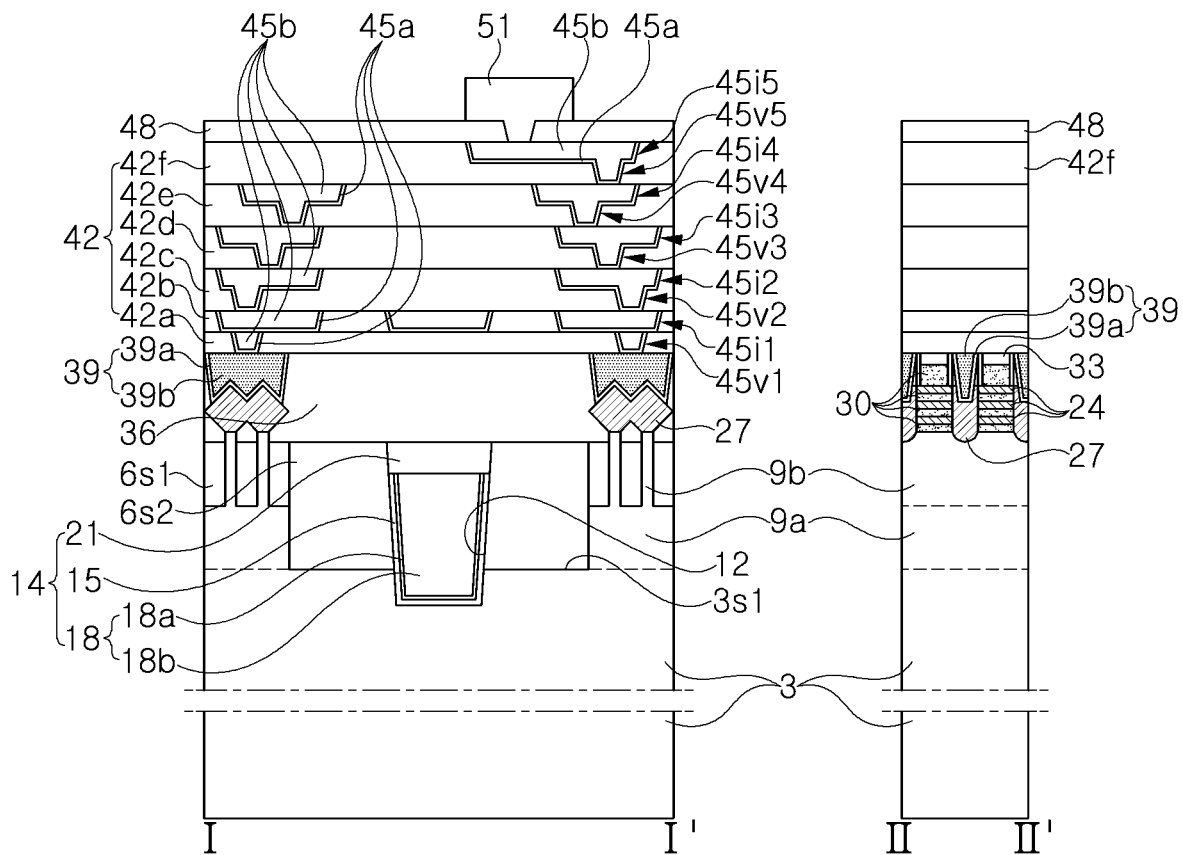
FIGS. 12A, 13A and 14A are cross-sectional views taken along lines I-I' and II-II' of FIG. 1A illustrating a method of fabricating a semiconductor device according to embodiments of the present disclosure.

A method of fabricating a semiconductor device according to an embodiment will be described. FIG. 11 is a schematic process flowchart illustrating a method of fabricating a semiconductor device, and FIGS. 12A to 14B are schematic views illustrating a method of fabricating a semiconductor device. Specifically, FIGS. 12A, 13A and 14A are cross-sectional views taken along lines I-I' and II-II' in FIG. 1A, and FIGS. 12B, 13B, and 14B 1B are cross-sectional views taken along line III-III' of FIG. 1B.

Figure 12B:
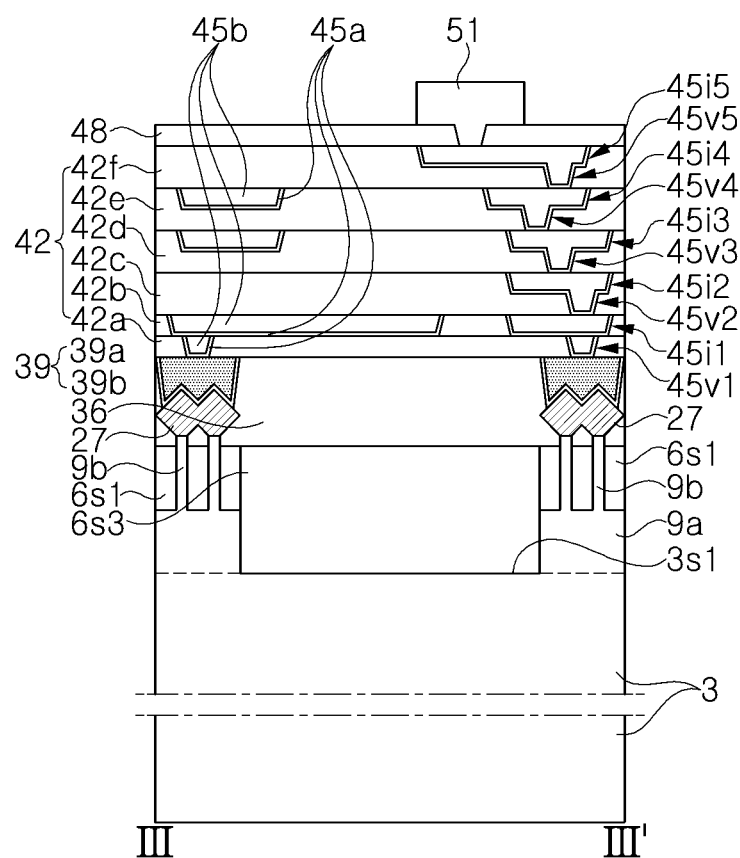
FIGS. 12B, 13B and 14B are cross-sectional views taken along line III-III' of FIG. 1B illustrating a method of fabricating a semiconductor device according to embodiments of the present disclosure.
Figure 13A:
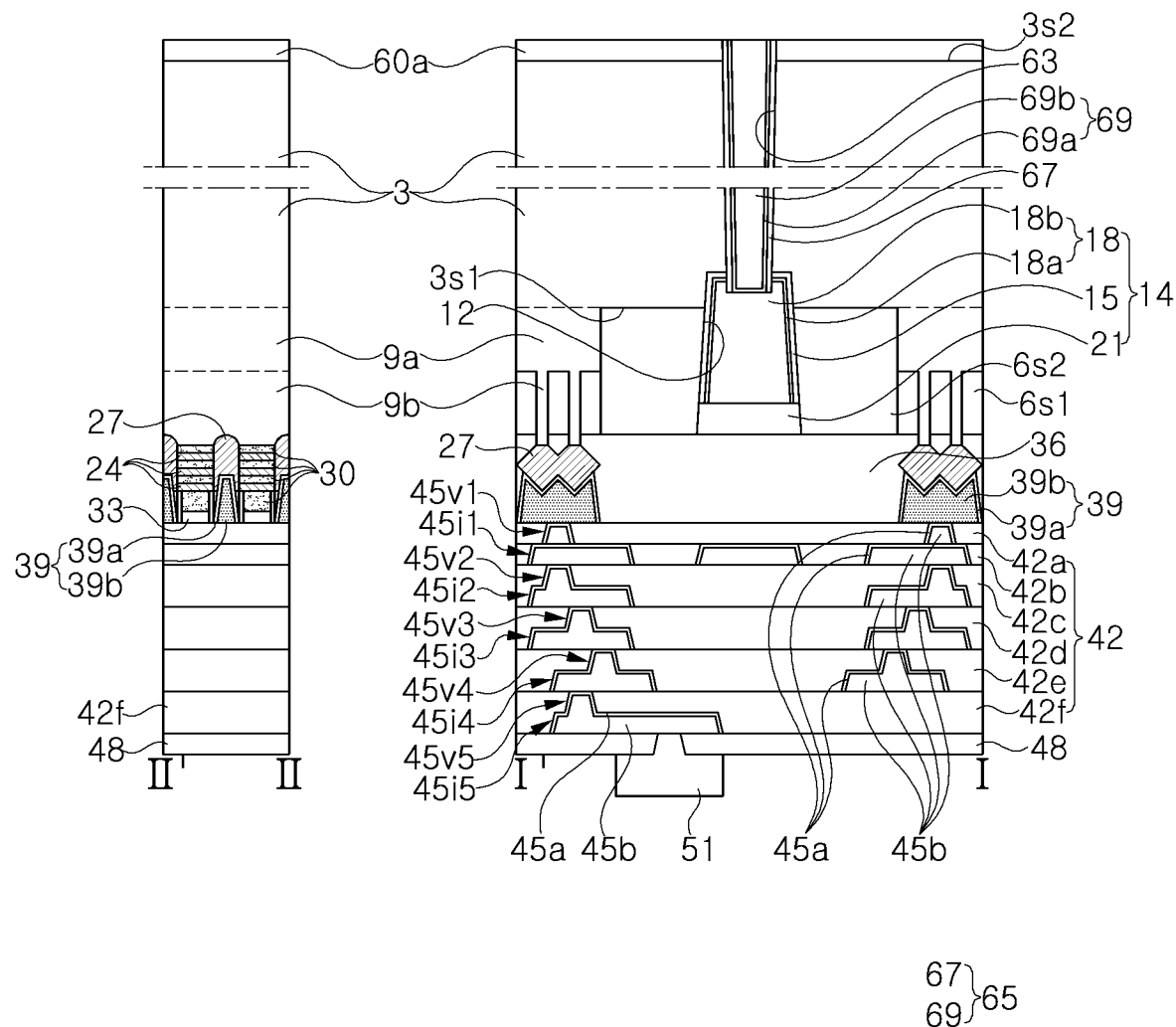

Referring to FIGS. 11, 12A and 12B, an active region 9 and an isolation region 6 may be formed on a first side 3*s*1 of a substrate 3 in block S10. The substrate 3 may be a semiconductor substrate. The isolation region 6 may include a first isolation layer 6*s*1 on a first region R1 of the substrate 3, a second isolation layer 6*s*2 on a second region R2 of the substrate 3, and a third isolation layer 6*s*3 on a third region R3 of the substrate 3. The active region 9 may include a base region 9*a* and an active fin 9*b* on the base region 9*a*. The first isolation layer 6*s*1 may be formed on the base region 9*a*, and may define the active fin 9*b*. The second and third isolation layers 6*s*2 and 6*s*3 may define the base region 9*a*, and may define a structure including the first isolation layer 6*s*1 and the active fin 9*b*.

A buried structure 14 including a conductive line 18 may be formed in block S20.

In an embodiment, the forming of the buried structure 14 may include forming a trench 12 penetrating through the second isolation layer 6*s*2 and extending inwardly of the substrate 3, forming an insulating liner 15 covering an internal wall of the trench 12, forming the conductive line 18 filling a portion of the trench 12 on the insulating liner 15, and forming an insulating capping pattern 21 filling the other portion of the trench 12 on the conductive line 18. However, embodiments of the present disclosure are not limited thereto. For example, in an embodiment, the trench 12 may not extend inwardly of the substrate 3 and may be formed in the second isolation layer 6*s*2.

A circuit device TR may be formed in block S30. The circuit devices TR may include source/drain regions 27, channel layers 24 between the source/drain regions 27, and gates 30 extending while surrounding the channel layers 24. The source/drain regions 27 and the channel layers 24 may be formed on the active fins 9*b*, and the gates 30 may be arranged in the form of a line extending in a width direction of each of the active fins 9*b*, perpendicular to a length direction of each of the active fins 9*b*. A gate capping layer 33 may be formed on the gates 30. An interlayer insulating layer 36 may be formed to cover at least one side of the circuit device TR.

A contact plug 39 may be formed to be electrically connected to the circuit device TR. For example, the contact plug 39 may include a plurality of the contact plugs 39, and some of the plurality of contact plugs 39 may penetrate through the interlayer insulating layer 36 to directly contact the source/drain regions 27.

An intermetallic insulating structure 42 and a front side interconnection structure 45 may be formed in block S40. In an embodiment, the front side interconnection structure 45 may be formed using at least one of a single damascene process and a dual damascene process. The single damascene process may include forming an insulating layer, forming a hole or trench to penetrate through the insulating layer, and forming a single damascene structure to fill the hole or trench. The single damascene structure may be a via or an interconnection layer. The dual damascene process may include forming an insulating layer, forming an opening penetrating through the insulating layer and having a hole and a trench, and forming a dual damascene structure to fill the opening. A bottom surface of the trench may be higher than a bottom surface of the insulating layer, and may penetrate through the insulating layer having a level lower than a level of the bottom surface of the trench. Accordingly, the dual damascene structure may include a via and an interconnection layer formed to be integrated with each other. For example, in an embodiment, the forming of the intermetallic insulating structure 42 and the front side interconnection structure 45 may include forming a first intermetallic insulating layer 42a to cover the contact plug 39 and the interlayer insulating layer 36, forming a first front side via 45v1 to be electrically connected to the contact plug 39 through the first intermetallic insulating layer 42a, forming a second intermetallic insulating layer 42b on the first intermetallic insulating layer 42a, forming a first front side interconnection layer 45i1 to penetrate through the second intermetallic insulating layer 42b, forming a third intermetallic insulating layer 42c on the second intermetallic insulating layer 42b, forming a second via 45v2 and a second front side interconnection layer 45i2 having a damascene structure to penetrate through the third intermetallic insulating layer 42c, forming a fourth intermetallic insulating layer 42d on the third intermetallic insulating layer 42c, a third via 45v3 and a third front side interconnection layer 45i3 having a damascene structure to penetrate through the fourth intermetallic insulating layer 42d, forming a fifth intermetallic insulating layer 42e on the fourth intermetallic insulating layer 42d, forming a fourth via 45v4 and a fourth front side interconnection layer 45i4 having a damascene structure to penetrate through the fifth intermetallic insulating layer 42e, forming a sixth intermetallic insulating layer 42f on the fifth intermetallic insulating layer 42e, and forming a fifth via 45v5 and a fifth front side interconnection layer 45i5 having a damascene structure to penetrate through the sixth intermetallic insulating layer 42f.

A front side insulating capping layer 48 may be formed on the intermetallic insulating structure 42 and the front side interconnection structure 45. A front pad 51 may be formed to be electrically connected to the front side interconnection structure 45 through the front side insulating capping layer 48.

Figure 13B:
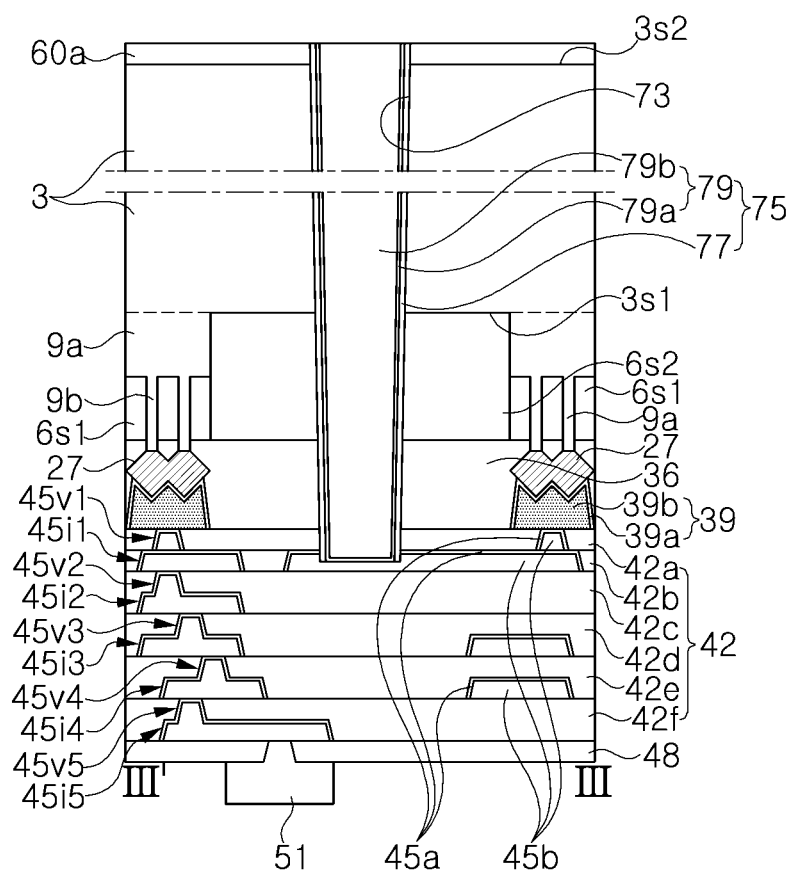
Figure 14A:
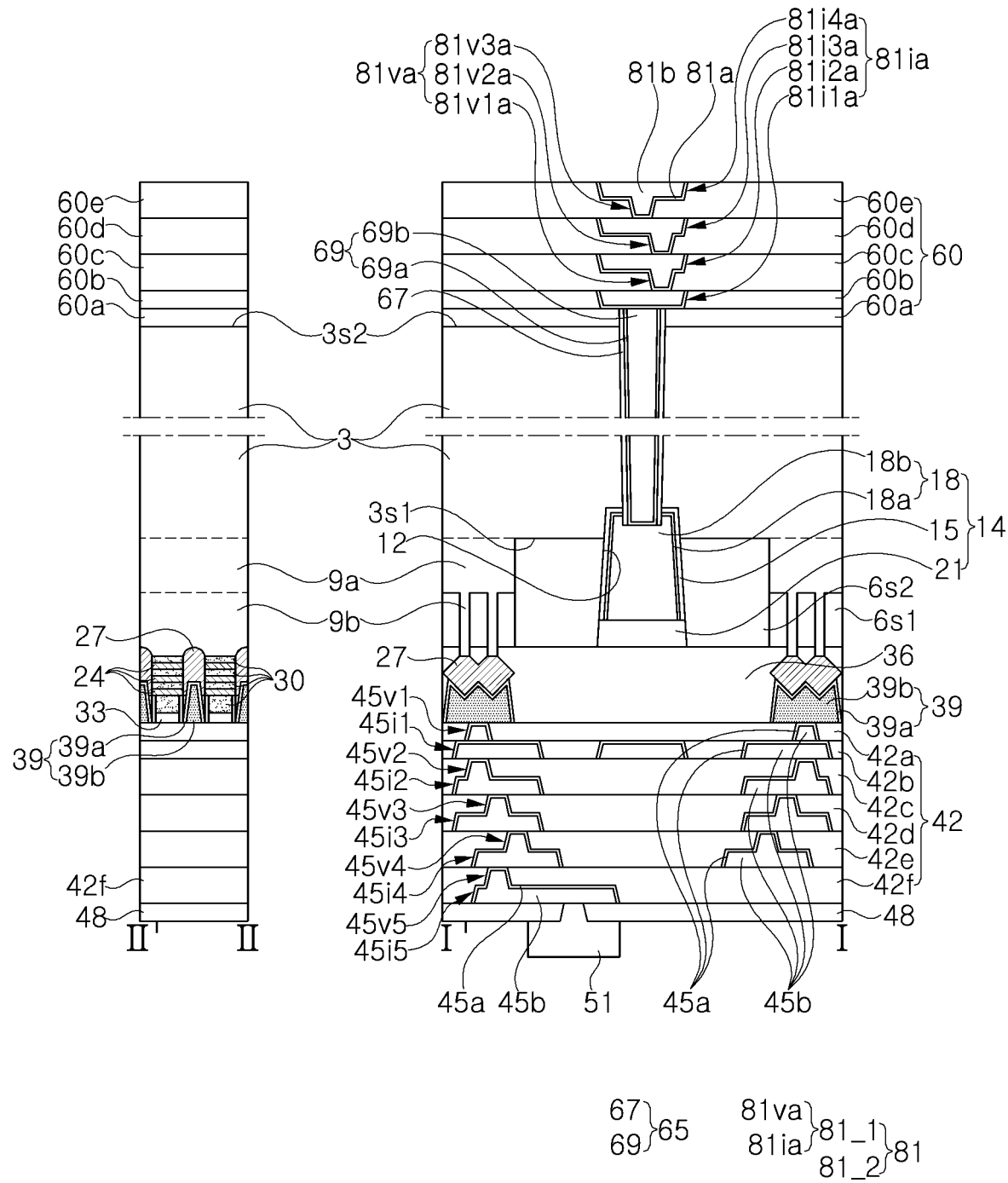

Referring to FIGS. 11, 13A, and 13B, a front surface of the substrate 3, formed to the front pad 51 in FIGS. 12A and 12B, may be inverted to face upwardly. A back-grinding process may then be performed to decrease a thickness of the substrate 3, and thus, a second side 3s2 of the substrate 3 having a decreased thickness may be formed.

A first back side insulating layer 60a may be formed on the second side 3s2 of the substrate 3.

The first back side insulating layer 60a may be illustrated as being disposed above the second side 3s2 of the substrate 3 based on FIGS. 13A and 13B, and may be illustrated as being disposed below the second side 3s2 of the substrate 3 based on FIGS. 2A and 3A.

In an embodiment, the first back side insulating layer 60a may be a back side protective layer protecting the substrate 3.

A first through-electrode structure 65 and a second through-electrode structure 75 may be formed to penetrate through at least the substrate 3 in block S50.

The first through-electrode structure 65 may penetrate through the first back side insulating layer 60a and the substrate 3 and may directly contact the conductive line 18 of the buried structure 14.

The forming of the first through-electrode structure 65 may include forming a first through-hole 63 to penetrate through the first back side insulating layer 60a and the substrate 3 and to expose the conductive line 18 of the buried structure 14, forming a first insulating spacer 67 on a sidewall of the first through-hole 63, and forming a first through-electrode 69 to fill the first through-hole 63. The first through-electrode 69 may include a conductive liner 69a, conformally covering the internal wall of the first through-hole 63 on which the first insulating spacer 67 is formed, and a conductive pattern 69b filling the first through-hole 63 on the conductive liner 69a.

The forming of the second through-electrode structure 75 may include forming a second through-hole 73 to penetrate through the first back side insulating layer 60a, the substrate 3, the third isolation layer 6s3, and the interlayer insulating layer 36 and to expose the first front side interconnection layer 45i1 of the front side interconnection structure 45, forming a second insulating spacer 77 on a sidewall of the second through-hole 73, and forming a second through-electrode 79 to fill the second through-hole 73. The second through-electrode 79 may include a conductive liner 79a, conformally covering the internal wall of the second through-hole 73 on which the second insulating spacer 77 is formed, and a conductive pattern 79b filling the second through-hole 73 on the conductive liner 79a.

In an embodiment, the first through-electrode structure 65 and the second through-electrode structure 75 may be simultaneously formed.

However, embodiments of the present disclosure are not limited thereto. For example, in an embodiment, the first through-electrode structure 65 and the second through-electrode structure 75 may be formed in different processes. For example, the first through-electrode structure 65 may first be formed, and the second through-electrode structure 75 may subsequently be formed after the formation of the first through-electrode structure 65. In an embodiment, the second through-electrode structure 75 may first be formed, and the first through-electrode structure 65 may subsequently be formed after the formation of the second through-electrode structure 75.

In an embodiment, the forming of the first through-electrode structure 65 and the second through-electrode structure 75 may include respectively forming the first through-hole 63 and the second through-hole 73 using different photolithography processes, simultaneously forming the first and second insulating spacers 67 and 77, and simultaneously forming the first and second through-electrodes 69 and 79.

Figure 14B:
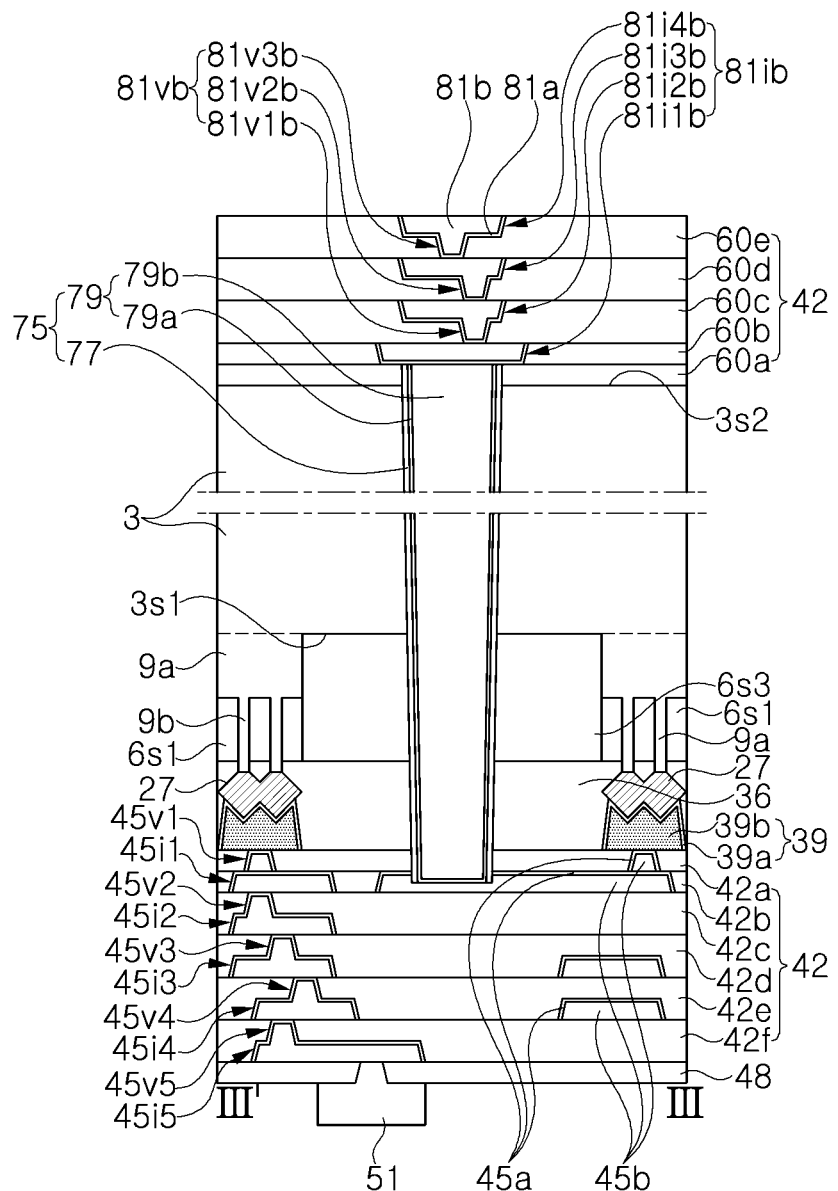

Referring to FIGS. 11, 14A, and 14B, a back side interconnection structure 81 may be formed on the second side 3s2 of the substrate 3 in block S60.

The back side interconnection structure 81 may include a first back side interconnection structure 811 directly contacting the first through-electrode 69 and a second back side interconnection structure 812 directly contacting the second through-electrode 79. In an embodiment, the back side interconnection structure 81 may be formed using a damascene process. For example, the respectively forming of the first and second back side interconnection structures 81_1 and 81_2 may include repeatedly performing a process of forming an insulating layer, forming a hole and/or a trench to penetrate through the insulating layer, and filling the hole and/or trench with a conductive material. For example, the forming of the back side interconnection structure 81 may include forming a second back side insulating layer 60b on the first back side insulating layer 60a, forming first back side interconnection layers 81i1a and 81i1b to penetrate through the second back side insulating layer 60b, forming a third back side insulating layer 60c on the second back side insulating layer 60b, forming first vias 81v1a and 81v1b and second back side interconnection layers 81i1a and 81i1b having a damascene structure to penetrate through the third back side insulating layer 60c, forming a fourth back side insulating layer 60d on the third back side insulating layer 60c, forming second vias 81v2a and 81v2b and third back side interconnection layers 81i3a and 81i3b having a damascene structure to penetrate through the fourth back side insulating layer 60d, forming a fifth back side insulating layer 60e on the fourth back side insulating layer 60d, and forming third vias 81v3a and 81v3b and the fourth back side interconnection layers 81i4a and 81i4b having a damascene structure to penetrate through the fifth back side insulating layer 60e.

Returning to FIGS. 2A, 2B, 3A and 3B, a back side insulating capping layer 84 may be formed to cover the fifth back side insulating layer 60e, and first and second back side pads 87a and 87b may be formed to each have at least a portion penetrating through the back side insulating capping layer 84.

Figure 15:
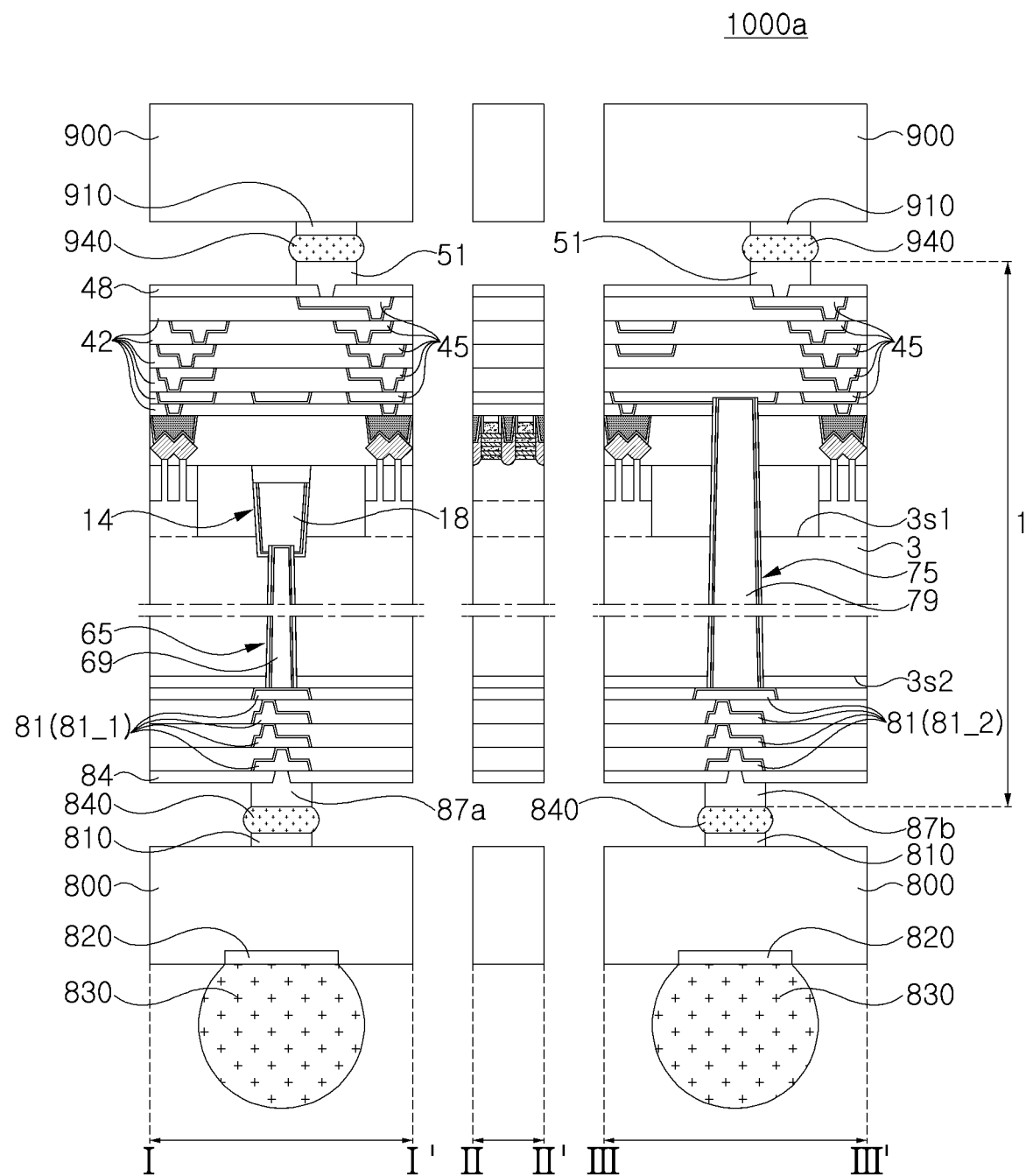
FIG. 15 is a schematic view of a semiconductor package including a semiconductor device taken along lines I-I', II-II' and III-III' of FIGS. 1A and 1B, respectively, according to an embodiment of the present disclosure.
Figure 16:
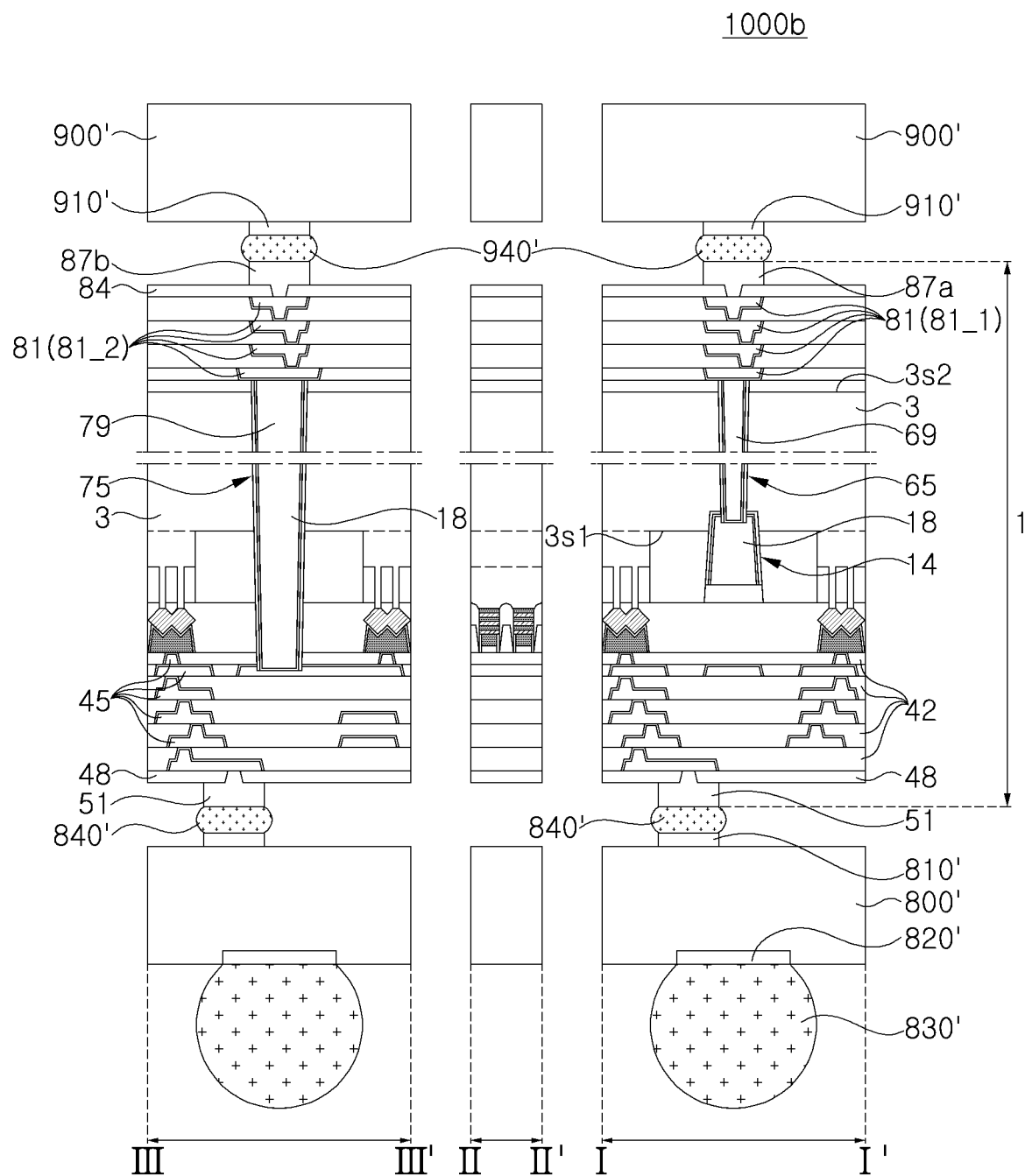
FIG. 16 is a schematic view of a semiconductor package including a semiconductor device taken along lines I-I', II-II' and III-III' of FIGS. 1A and 1B, respectively, according to an embodiment of the present disclosure.

Semiconductor packages including the above-described semiconductor device 1 will be described with reference to FIGS. 15 and 16, respectively. FIG. 15 is a cross-sectional view illustrating an embodiment of a semiconductor package including the above-described semiconductor device 1, and FIG. 16 is a cross-sectional view illustrating an embodiment of a semiconductor package including the above-described semiconductor device 1.

In an embodiment, referring to FIG. 15, a semiconductor package 1000a may include a base substrate 800, a semiconductor device 1 on the base substrate 800, and an upper semiconductor device 900 on the semiconductor device 1, first connection patterns 840 electrically connecting the base substrate 800 and the semiconductor device 1 to each other, second connection patterns 940 electrically connecting the semiconductor device 1 and the upper semiconductor device 900 to each other, and lower connection patterns 830 below the base substrate 800.

In an embodiment, the semiconductor device 1 may include a microprocessor such as a central processor unit (CPU), a graphics processing unit (GPU), an application processor (AP), or the like, or a logic chip such as a field programmable gate array (FPGA), an application-specific IC (ASIC), or the like. However, embodiments of the present disclosure are not limited thereto.

In an embodiment, the upper semiconductor device 900 may include at least one of a logic chip, a memory chip, and a sensor chip. For example, the upper semiconductor device 900 may include a microprocessor such as a central processor unit (CPU), a graphic processor unit (GPU), an application processor (AP), or the like, or a logic chip such as a field programmable gate array (FPGA), an application-specific (ASIC), or the like, or a memory chip. The memory chip may be a volatile memory chip or a non-volatile memory chip. For example, the volatile memory chip may include a dynamic random access memory (DRAM), a static RAM (SRAM), a thyristor RAM (TRAM), a zero capacitor RAM (ZRAM), or a twin transistor RAM (TTRAM). Also, the non-volatile memory chip may include, for example, a flash memory, a magnetic RAM (MRAM), a spin-transfer torque MRAM (STT-MRAM), a ferroelectric RAM (FRAM), a phase change RAM (PRAM), a resistive RAM (RRAM), a nanotube RRAM, a polymer RAM, a nano floating gate memory, a holographic memory, a molecular electronics memory, or an insulator resistance change memory. However, embodiments of the present disclosure are not limited thereto.

The base substrate 800 may be a printed circuit board or an interposer board. The base substrate 800 may include base lower pads 820, electrically connected to the lower connection patterns 830, and upper base pads 810 electrically connected to the first connection patterns 840.

The upper semiconductor device 900 may further include pads 910 electrically connected to the second connection patterns 940.

In an embodiment, the semiconductor device 1 may be a semiconductor device according to one of the embodiments described with reference to FIGS. 1 to 10, or may be a semiconductor device formed according to an embodiment described with reference to FIGS. 11 to 14B.

In the semiconductor device 1, the front pads 51 may directly contact the second connection patterns 940, and the first and second back side pads 87a and 87b may directly contact the first connection patterns 840. Accordingly, in the semiconductor device 1, a first side 3s1 of the substrate 3 may face the upper semiconductor device 900, and a second side 3s2 of the substrate 3 may face the base substrate 800.

In an embodiment, referring to FIG. 16, a semiconductor package 1000b may include a base substrate 800', a semiconductor device 1 on the base substrate 800', an upper semiconductor device 900' on the semiconductor device 1, first connection patterns 840' electrically connecting the base substrate 800' and the semiconductor device 1 to each other, second connection patterns 940' electrically connecting the semiconductor device 1 and the semiconductor device 900' to each other, and lower connection patterns 830' below the base substrate 800'.

The base substrate 800' may be substantially the same as the base substrate 800 described with reference to FIG. 15. The upper semiconductor device 900' may be substantially the same as the upper semiconductor device 900 described with reference to FIG. 15.

The base substrate 800' may include base lower pads 820', electrically connected to the lower connection patterns 830', and base upper pads 810' electrically connected to the first connection patterns 840'. The upper semiconductor device 900' may further include pads 910' electrically connected to the second connection patterns 940'.

In an embodiment, the semiconductor device 1 may be a semiconductor device according to one of the embodiments described with reference to FIGS. 1 to 10, or a semiconductor device formed according to the embodiment described with reference to FIGS. 11 to 14B.

In the semiconductor device 1, the front pads 51 may directly contact the first connection patterns 840', and the back side pads 87a and 87b may directly contact the second connection patterns 940'. Accordingly, in the semiconductor device 1, the first side 3s1 of the substrate 3 may face the base substrate 800', and the second side 3s2 of the substrate 3 may face the upper semiconductor device 900'.

As described above, according to embodiments of the present disclosure, a plurality of front side interconnection layers having different height levels may be formed on a front surface of a substrate, a plurality of back side interconnection layers having different height levels may be disposed on a back side surface of the substrate, and through-electrode structures may be disposed to penetrate through the substrate. Thus, an integration density of a semiconductor device may be increased, and a size of the semiconductor device may be decreased. Through-electrodes may be provided to have various widths and/or various heights, and thus, a semiconductor device having an increased performance may be provided.

While non-limiting embodiments have been shown and described above, it will be apparent to those skilled in the art that modifications and variations could be made without departing from the scope of the present disclosure.

What is claimed is:

1. A semiconductor device comprising:
    a semiconductor substrate having a first side and a second side opposing each other;
    an active region and an isolation region on the first side of the semiconductor substrate;
    a circuit device disposed on the active region, on the first side of the semiconductor substrate;
    a front side interconnection structure on the first side of the semiconductor substrate, the front side interconnection structure including a plurality of front side interconnection layers electrically connected to the circuit device and disposed on different levels from each other, and front side vias electrically connecting the plurality of front side interconnection layers to each other;
    a first back side interconnection structure and a second back side interconnection structure, the first and second back side interconnection structures are disposed below the second side of the semiconductor substrate;
    a buried structure having at least a portion thereof disposed in the isolation region, the buried structure including a conductive line;
    a first through-electrode structure including a first through-electrode directly contacting the conductive line and extending downwardly to penetrate through the semiconductor substrate between the conductive line and the first back side interconnection structure, and a first insulating spacer on lateral side surfaces of the first through-electrode; and
    a second through-electrode structure including a second through-electrode penetrating through the semiconductor substrate between a first front side interconnection layer of the plurality of the front side interconnection layers and the second back side interconnection structure, the second through-electrode directly contacting the first front side interconnection layer, the second through-electrode structure including a second insulating spacer on lateral side surfaces of the second through-electrode,
    wherein the first front side interconnection layer is disposed on a level higher than a level of the conductive line in relation to the second side of the semiconductor substrate.

2. The semiconductor device of claim 1, wherein a width of the second through-electrode is greater than a width of the first through-electrode.

3. The semiconductor device of claim 1, wherein:
    each of the first and second back side interconnection structures includes a plurality of back side interconnection layers, disposed on different height levels, and back side vias electrically connected to the plurality of back side interconnection layers,
    the first through-electrode directly contacts a first back side interconnection layer of the first back side interconnection structure,
    the second through-electrode directly contacts a first back side interconnection layer of the second back side interconnection structure,
    the conductive line and the first back side interconnection layer of the first back side interconnection structure are arranged in lines extending longitudinally in a same direction as each other, and
    the conductive line overlaps the first back side interconnection layer of the first back side interconnection structure.

4. The semiconductor device of claim 1, wherein:
    the isolation region includes a first isolation layer, a second isolation layer, and a third isolation layer,
    the first isolation layer defines at least a portion of the active region,
    at least a portion of the conductive line is disposed in the second isolation layer, and
    a portion of the second through-electrode structure penetrates through the third isolation layer.

5. The semiconductor device of claim 4, wherein a distance between a lower surface of the first isolation layer and the second side of the semiconductor substrate is greater than a distance between a lower surface of each of the second and third isolation layers and the second side of the semiconductor substrate.

6. The semiconductor device of claim 4, wherein the buried structure further includes an insulating liner directly contacting at least a portion of lateral side surfaces of the conductive line and an insulating capping pattern disposed on the conductive line.

7. The semiconductor device of claim 1, wherein a width of an upper region of the first through-electrode is less than a width of a lower region of the conductive line.

8. The semiconductor device of claim 1, wherein a width of an upper region of the first through-electrode is greater than a width of a lower region of the conductive line.

9. The semiconductor device of claim 1, wherein the first through-electrode directly contacts at least a portion of lateral side surfaces of a lower region of the conductive line.

10. The semiconductor device of claim 1, wherein the buried structure includes a first portion disposed in the isolation region and a second portion disposed in the semiconductor substrate below the isolation region.

11. The semiconductor device of claim 1, wherein a lower surface of the conductive line is disposed on a level higher than a level of a lower surface of the isolation region.

12. The semiconductor device of claim 1, wherein:
    the active region includes an active fin protruding from the semiconductor substrate in a vertical direction that is perpendicular to the second side of the semiconductor substrate,
    the isolation region includes a isolation layer covering at least a portion of lateral side surfaces of the active fin, and
    the circuit device includes a gate intersecting the active fin, and source/drain regions on the active fin.

13. The semiconductor device of claim 12, wherein:
    the circuit device further includes a plurality of channel layers spaced apart from each other in the vertical direction on the active fin and disposed between the source/drain regions, and
    the gate surrounds each of the plurality of channel layers while intersecting the active fin.

* * * * *